(12) United States Patent
Kurita et al.

(10) Patent No.: US 7,598,117 B2
(45) Date of Patent: Oct. 6, 2009

(54) METHOD FOR MANUFACTURING SEMICONDUCTOR MODULE USING INTERCONNECTION STRUCTURE

(75) Inventors: Yoichiro Kurita, Kanagawa (JP); Koji Soejima, Kanagawa (JP); Masaya Kawano, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 395 days.

(21) Appl. No.: 11/580,869

(22) Filed: Oct. 16, 2006

(65) Prior Publication Data
US 2007/0086166 A1    Apr. 19, 2007

(30) Foreign Application Priority Data
Oct. 18, 2005    (JP)    ............... 2005-303395

(51) Int. Cl.
*H01L 21/50* (2006.01)
*H01L 21/48* (2006.01)
*H01L 21/44* (2006.01)

(52) U.S. Cl. ............... 438/106; 438/125; 438/118; 438/108; 438/612; 438/613; 438/614

(58) Field of Classification Search ............ 438/106, 438/125, 118, 108, 612, 613, 614
See application file for complete search history.

(56) References Cited

U.S. PATENT DOCUMENTS

| | | | | |
|---|---|---|---|---|
| 6,603,210 B2* | 8/2003 | Kishimoto et al. | ............ | 257/781 |
| 6,784,547 B2* | 8/2004 | Pepe et al. | ............ | 257/758 |
| 6,951,773 B2* | 10/2005 | Ho et al. | ............ | 438/106 |

FOREIGN PATENT DOCUMENTS

| | | |
|---|---|---|
| CN | 13579111 | 7/2002 |
| EP | 1 207 555 A1 | 5/2002 |
| JP | 2001-345418 | 12/2001 |

* cited by examiner

*Primary Examiner*—Luan C Thai
(74) *Attorney, Agent, or Firm*—Young & Thompson

(57) ABSTRACT

In a method for manufacturing a semiconductor module, a metal layer is formed on a support substrate. Then, first conductive posts and a first insulating layer are formed on the metal layer. The first insulating layer surrounds the sides of the first conductive posts. Then, second conductive posts are formed above the first conductive posts. The second conductive posts are electrically connected to the first conductive posts. Then, a second insulating layer is formed so as to cover the second conductive posts. The second insulating layer is made of adhesive resin. Finally, a semiconductor device is adhered to the second conductive posts by the second insulating layer while a gap between the first semiconductor device and the first insulating layer is sealed by the second insulating layer.

19 Claims, 22 Drawing Sheets

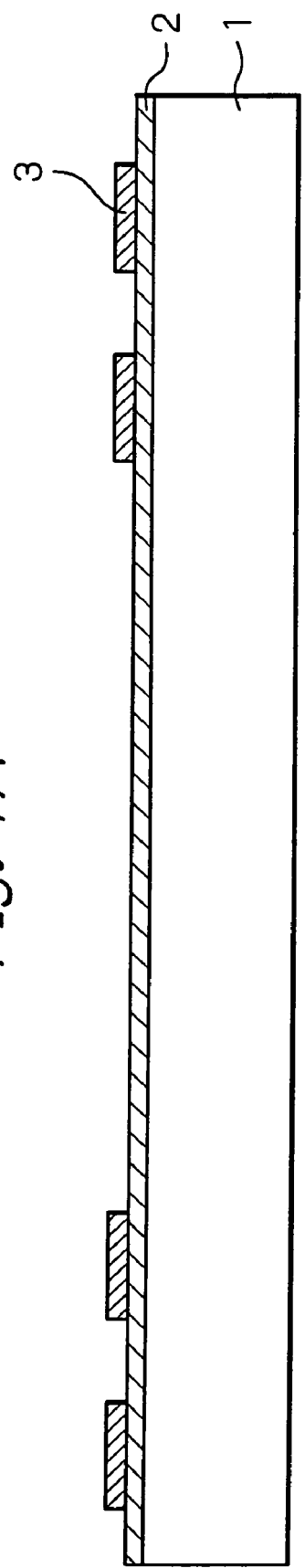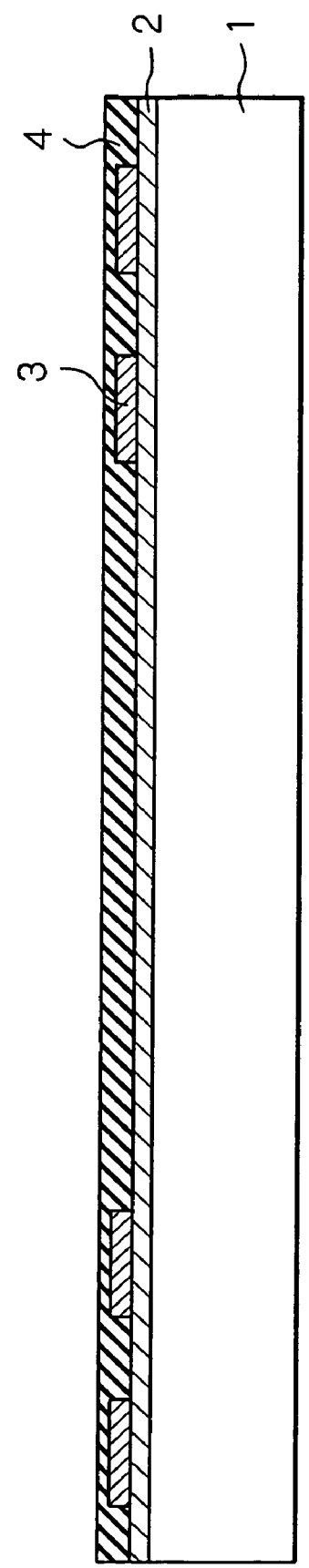

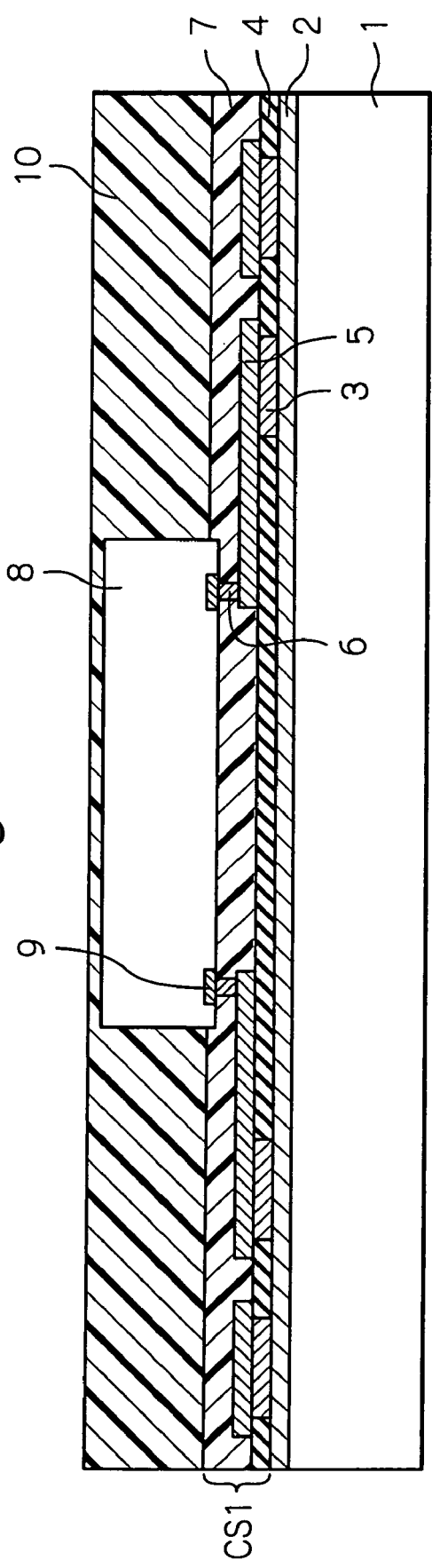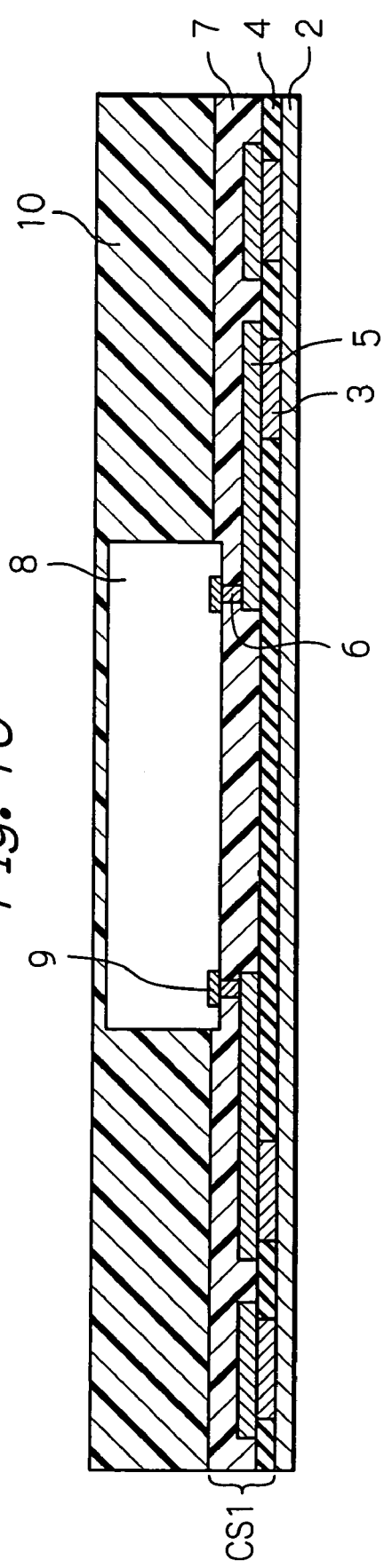

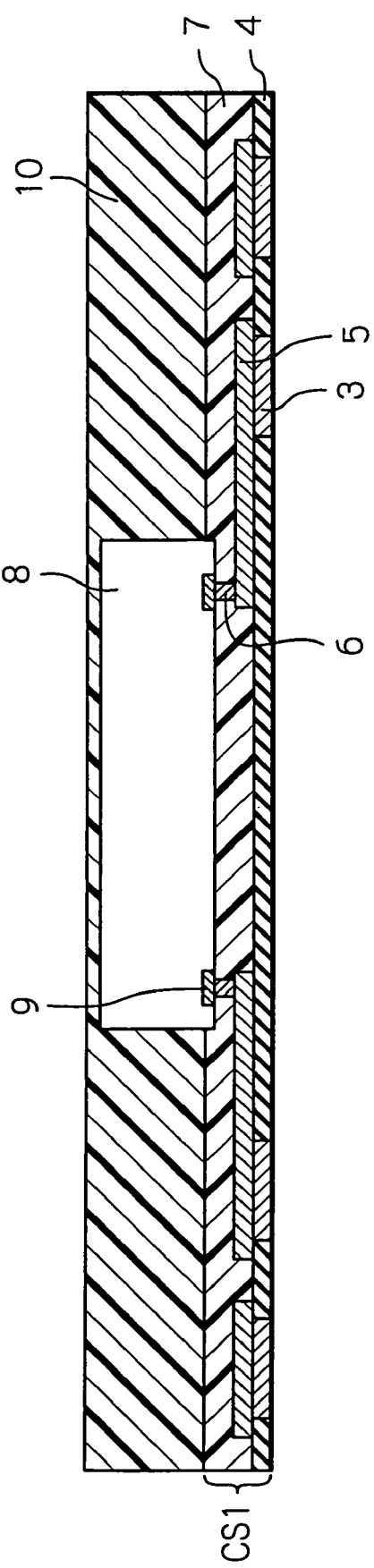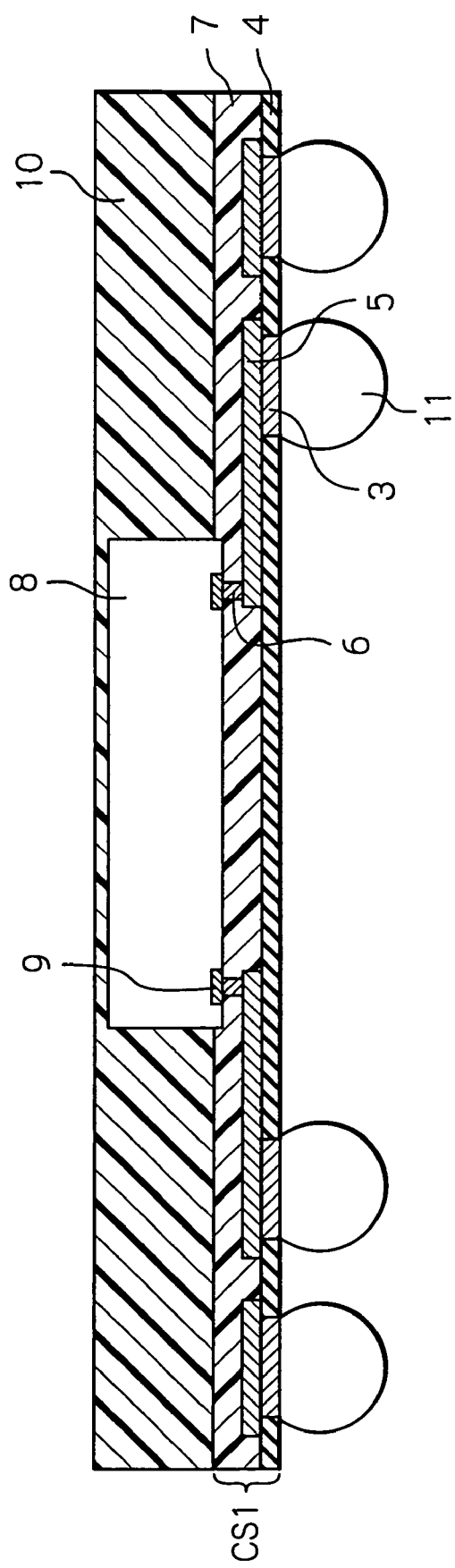

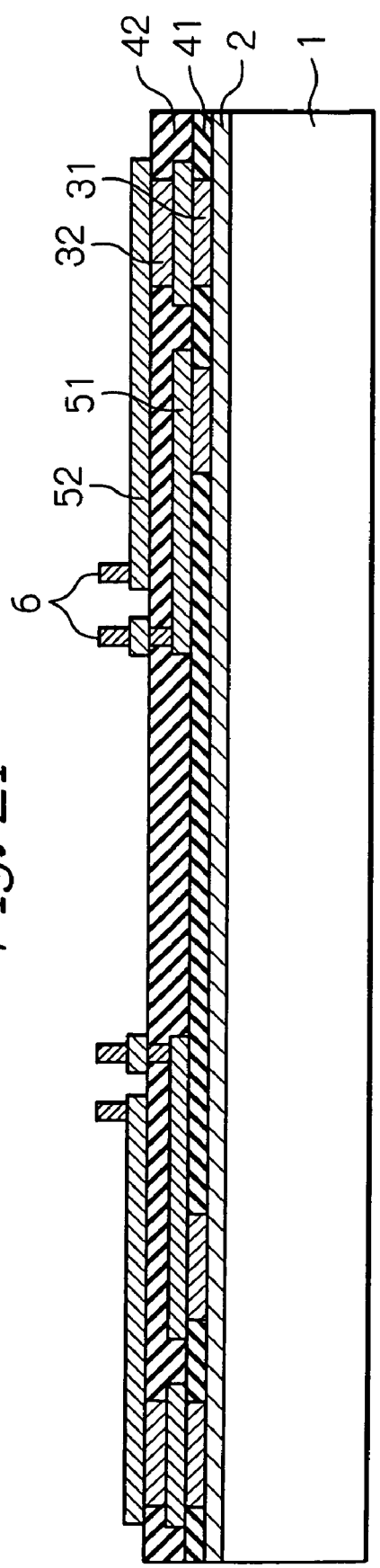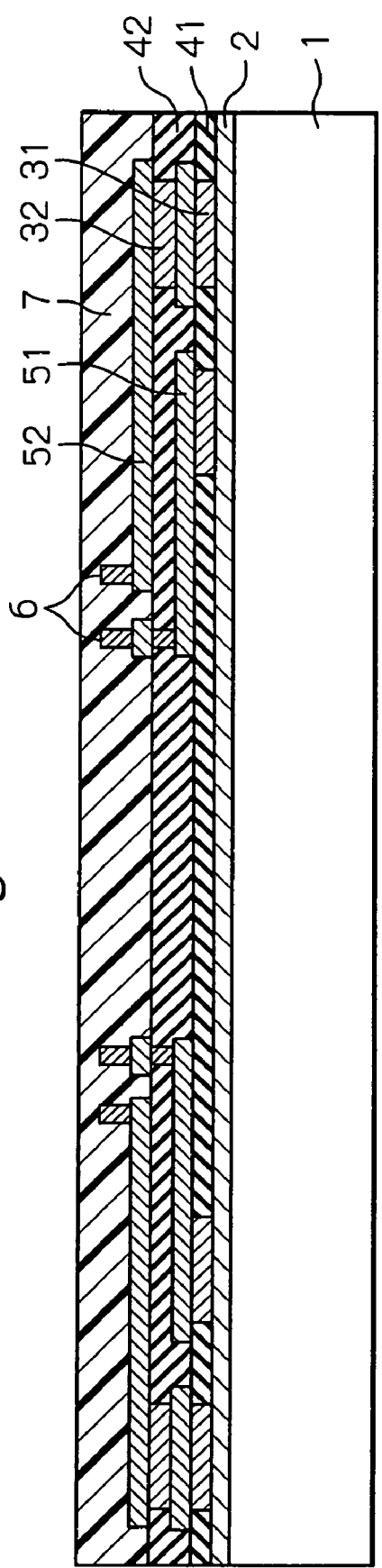

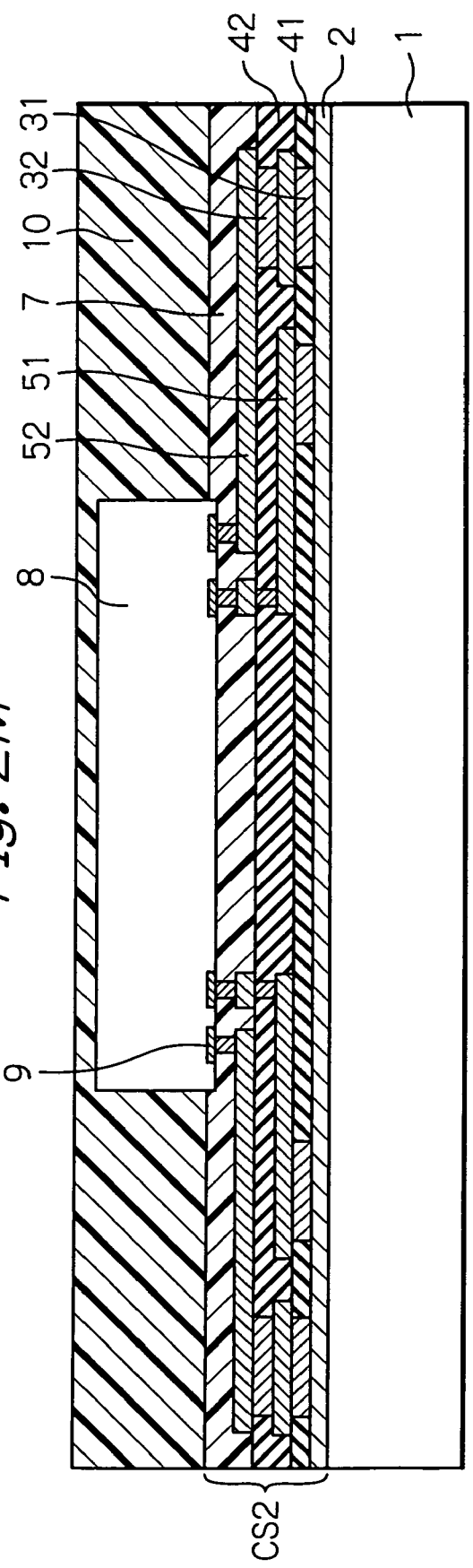
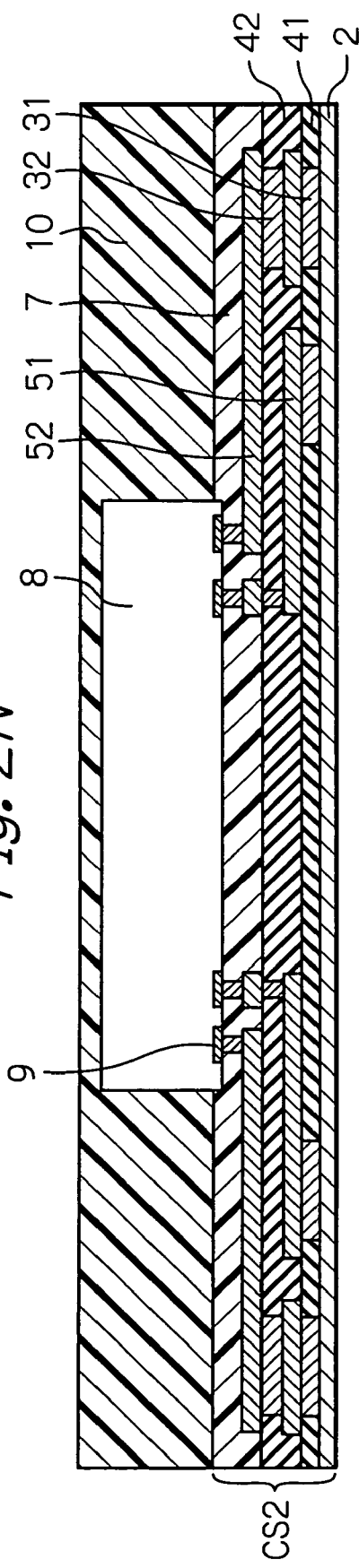

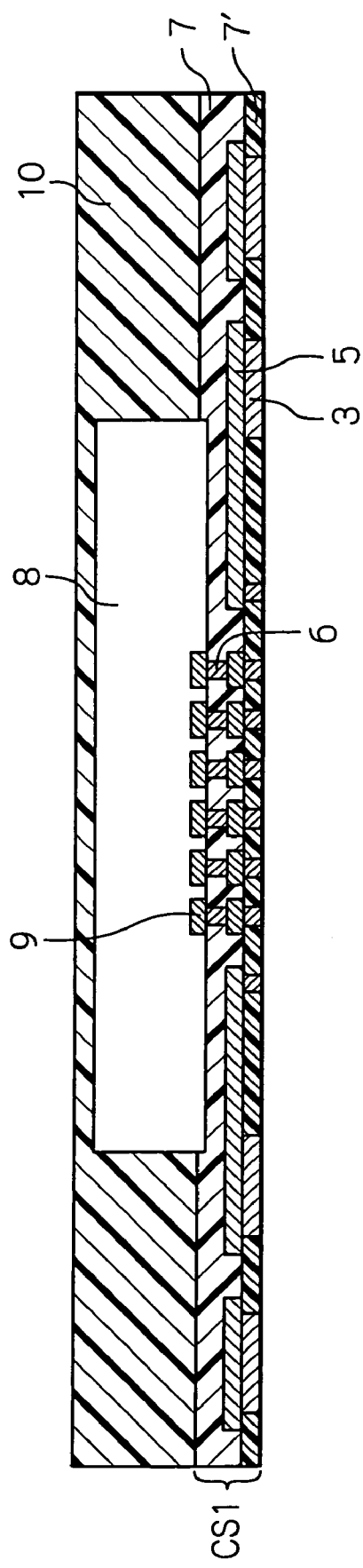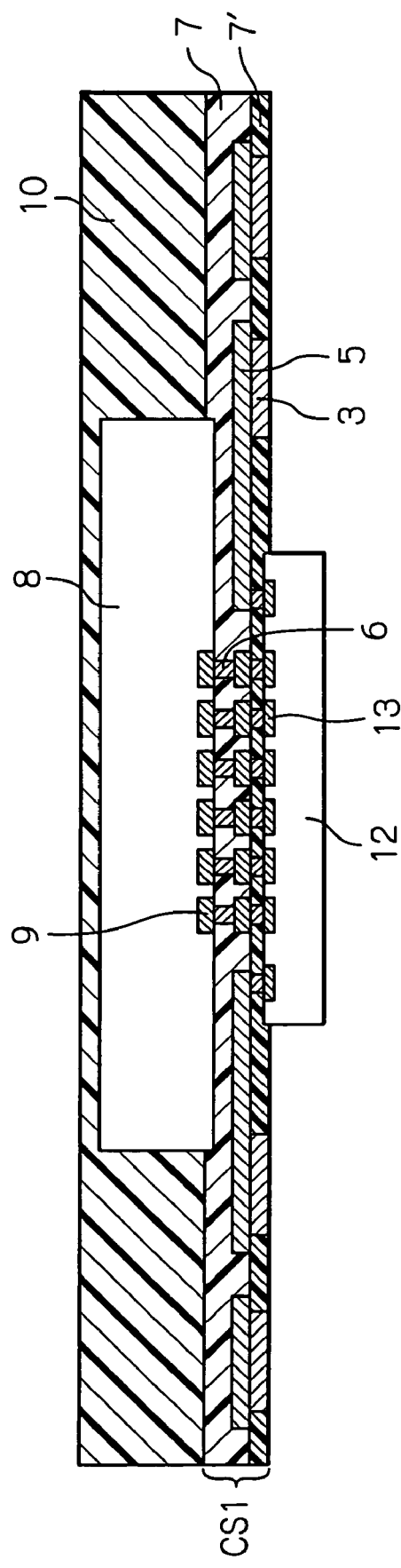

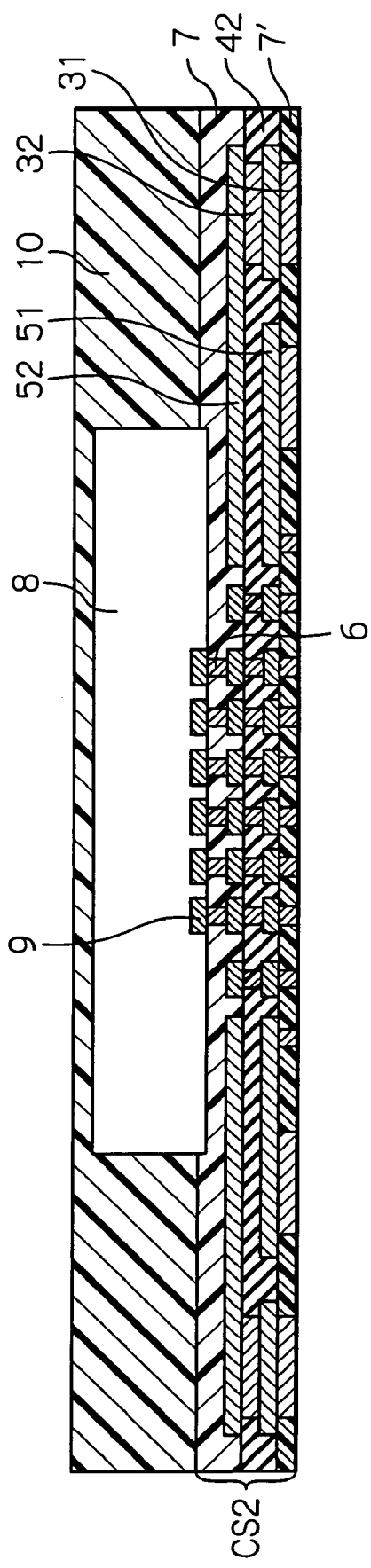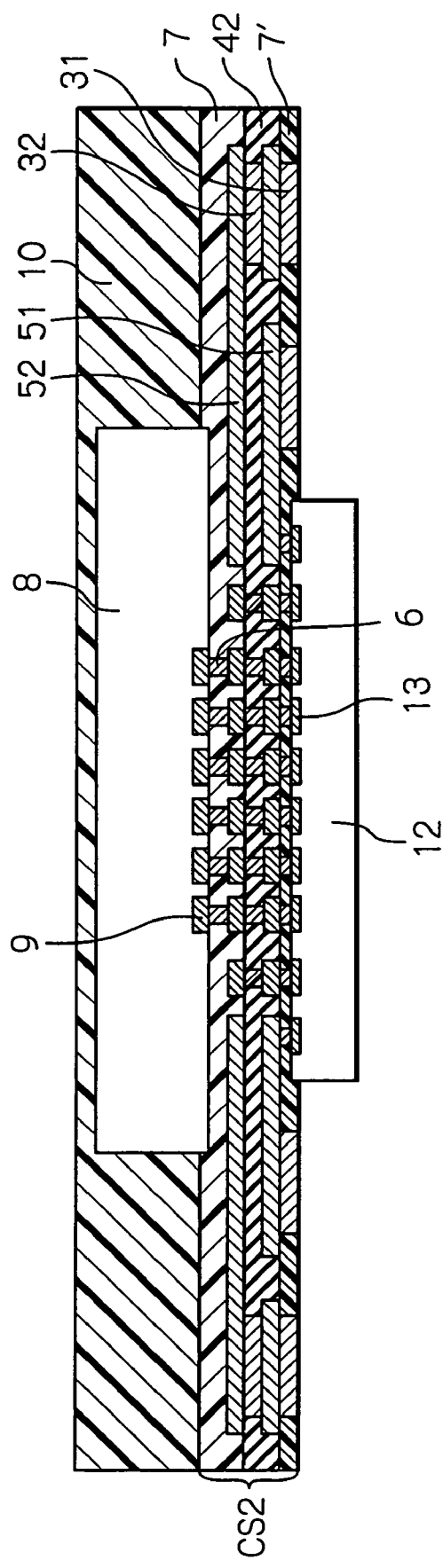

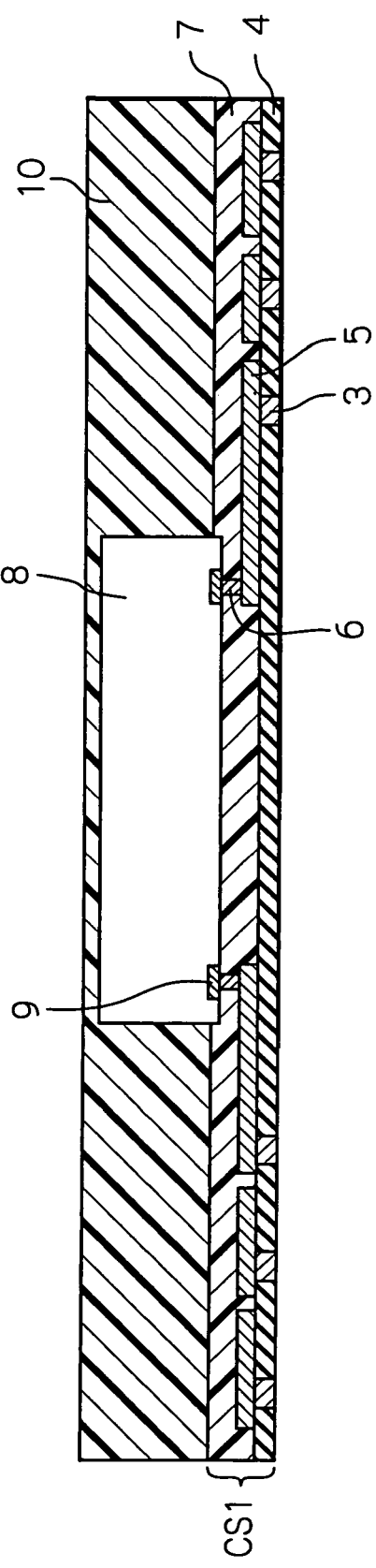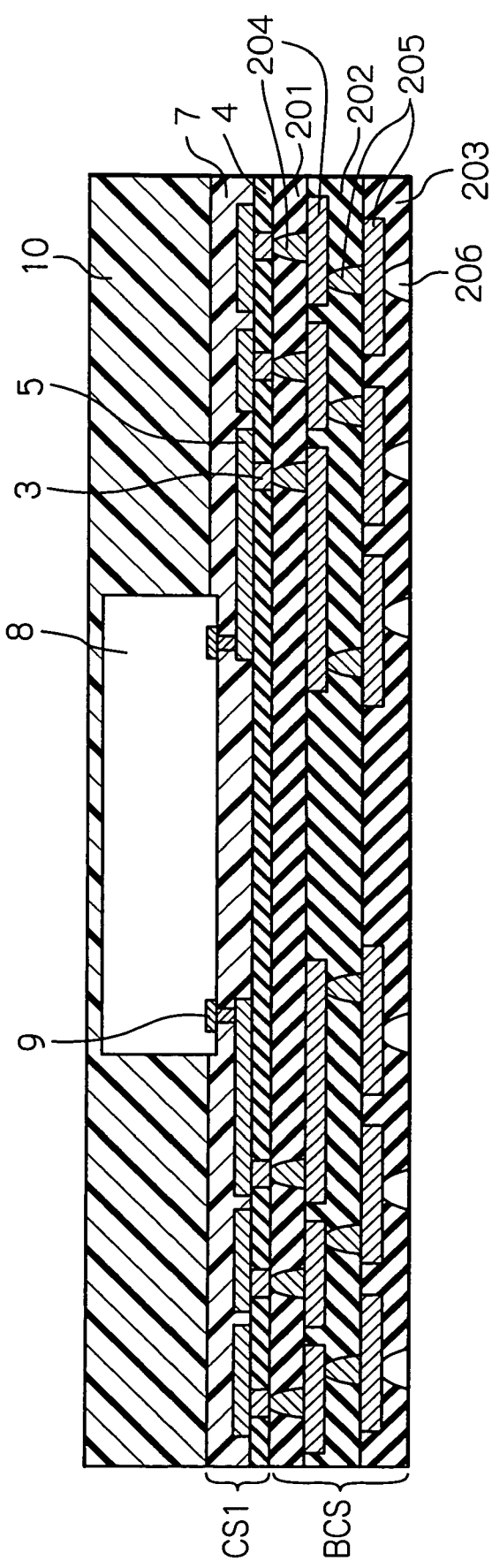

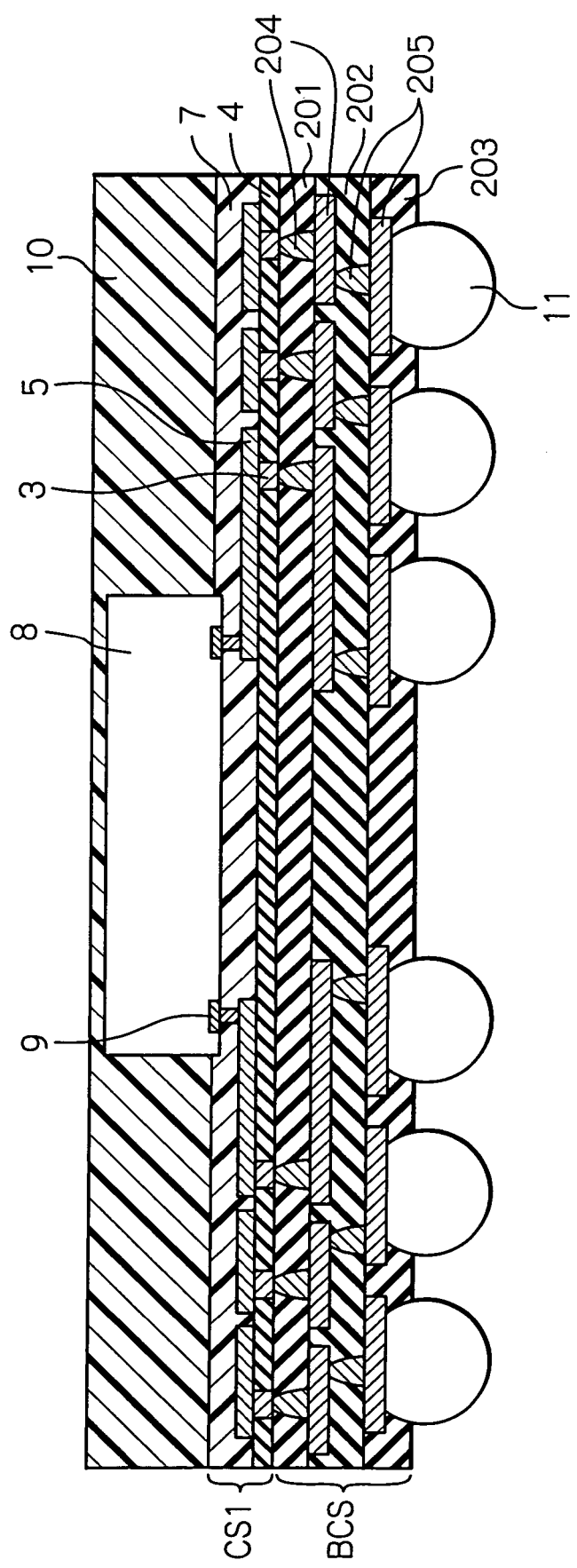

METHOD FOR MANUFACTURING SEMICONDUCTOR MODULE USING INTERCONNECTION STRUCTURE

BACKGROUND OF THE INVENTION

1. Field of the Invention

The present invention relates to a method for manufacturing a semiconductor module.

2. Description of the Related Art

In a prior art method for manufacturing a semiconductor module, a semiconductor chip associated with electrodes is faced down and adhered to a printed circuit board associated with external terminals. Then, a sealing resin is supplied so that a gap between the semiconductor chip and the printed circuit board is sealed (see: JP 2001-345418 A).

SUMMARY OF THE INVENTION

In the above-described prior art method, however, since there is a large difference in thermal expansion coefficient between the semiconductor chip and the printed circuit board, the position accuracy of the electrodes of the semiconductor chip relative to the external terminals of the printed circuit board would deteriorate. As a result, the adhesion accuracy of the electrodes of the semiconductor chip relative to the external electrodes of the printed circuit board would deteriorate so that the quality of the semiconductor module would also deteriorate.

According to the present invention, in a method for manufacturing a semiconductor module, a metal layer is formed on a support substrate. Then, first conductive posts and a first insulating layer are formed on the metal layer. The first insulating layer surrounds the sides of the first conductive posts. Then, second conductive posts are formed above the first conductive posts. The second conductive posts are electrically connected to the first conductive posts. Then, a second insulating layer is formed so as to cover the second conductive posts. The second insulating layer is made of adhesive resin. Finally, a semiconductor device is adhered to the second conductive posts by the second insulating layer while a gap between the first semiconductor device and the first insulating layer is sealed by the second insulating layer.

Since there can be no substantial difference in thermal expansion coefficient between the support substrate and the semiconductor device, the position accuracy of electrodes of the semiconductor device relative to external electrodes of the support substrate would improve.

Note that the support substrate and the metal layer are removed before the semiconductor module is mounted on a printed circuit board or the like. In this case, the spacing between the electrodes of the semiconductor device is usually expanded by a connection structure including the first conductive posts, the first insulating layer, the second conductive posts and the second insulating layer to the spacing between the external electrodes of the interconnection structure. Therefore, the semiconductor module can easily be mounted on the printed circuit board or the like.

BRIEF DESCRIPTION OF THE DRAWINGS

The present invention will be more clearly understood from the description set forth below, with reference to the accompanying drawings, wherein:

FIGS. 1A through 1L are cross-sectional views for explaining a first embodiment of the method for manufacturing a semiconductor module according to the present invention;

FIGS. 3A, 3B and 3C are cross-sectional views for explaining a third embodiment of the method for manufacturing a semiconductor module according to the present invention;

FIGS. 4A, 4B and 4C are cross-sectional views for explaining a fourth embodiment of the method for manufacturing a semiconductor module according to the present invention;

FIGS. 5A, 5B and 5C are cross-sectional views for explaining a fifth embodiment of the method for manufacturing a semiconductor module according to the present invention.

DESCRIPTION OF THE PREFERRED EMBODIMENTS

A first embodiment of the method for manufacturing a semiconductor module according to the present invention will now be explained with reference to FIGS. 1A through 1L.

First, referring to FIG. 1A, a support substrate 1 such as a silicon wafer is prepared. Then, a seed metal layer 2 made of Cu or Ni as an electroplating intervening layer is deposited on the entire surface by a sputtering process or the like. Then, conductive posts (pads) 3 made of Cu or Ni are formed on the seed metal layer 2 by a photolithography process and an electroplating process using the seed metal layer 2 as a cathode electrode. Note that, if the conductive posts 3 are made of Cu, a thin copper diffusion preventing layer (not shown) made of Ni can also be formed by a photolithography process and an electroplating process using the seed metal layer 2 as a cathode electrode before the formation of the conductive posts 3.

Next, referring to FIG. 1B, an insulating resin layer 4 made of polyimide resin or epoxy resin is coated on the entire surface by a spin-coat process, and then, sintered. Note that the insulating resin layer 4 can be formed by adhering an insulating resin film made of polyimide resin or epoxy resin on the entire surface.

Figure 1C:
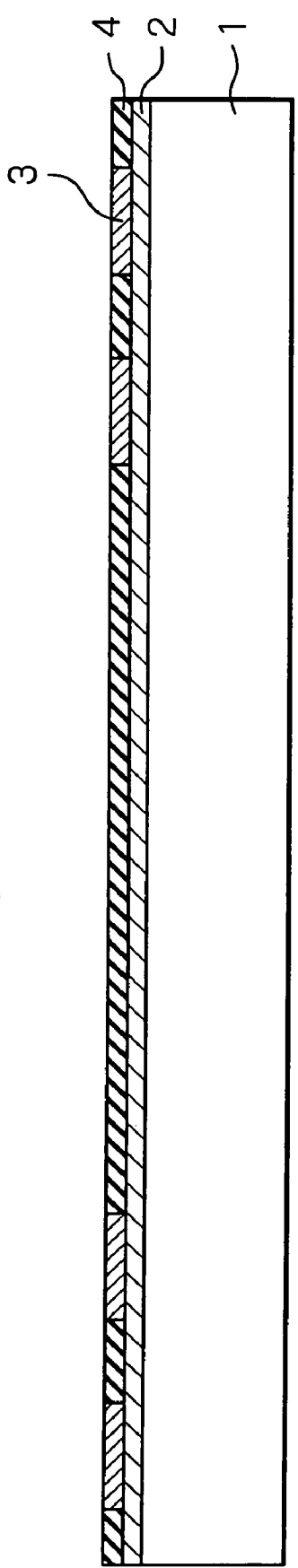

Next, referring to FIG. 1C, the insulating resin layer 4 is flattened by a chemical-mechanical polishing (CMP) process, a grinding process or a cutting process to expose the upper surface of the conductive posts 3.

Figure 1D:
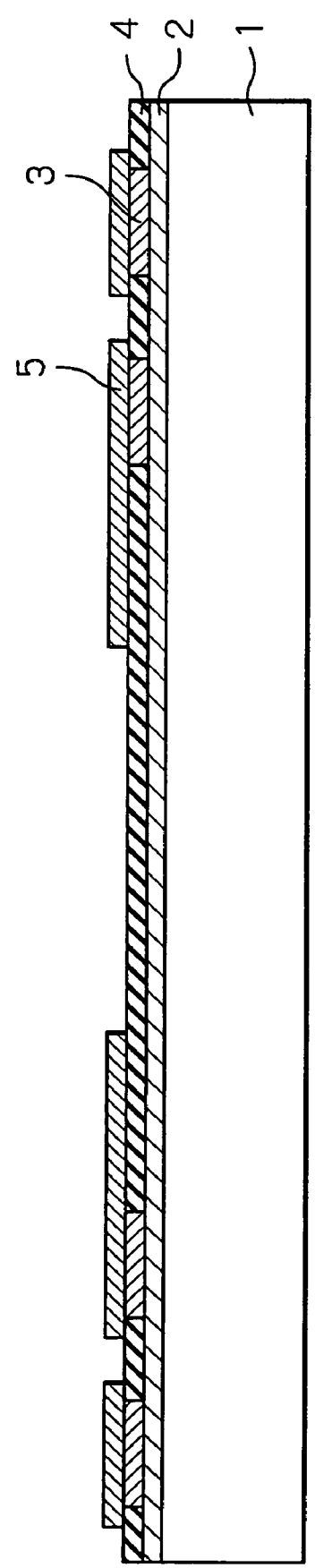

Next, referring to FIG. 1D, a conductive pattern layer 5 serving as interconnections made of Cu or Ni is formed by a photolithography process and an electroplating process using the seed metal layer 2 as a cathode electrode. The conductive pattern layer 5 is electrically connected to the conductive posts 3.

Figure 1E:
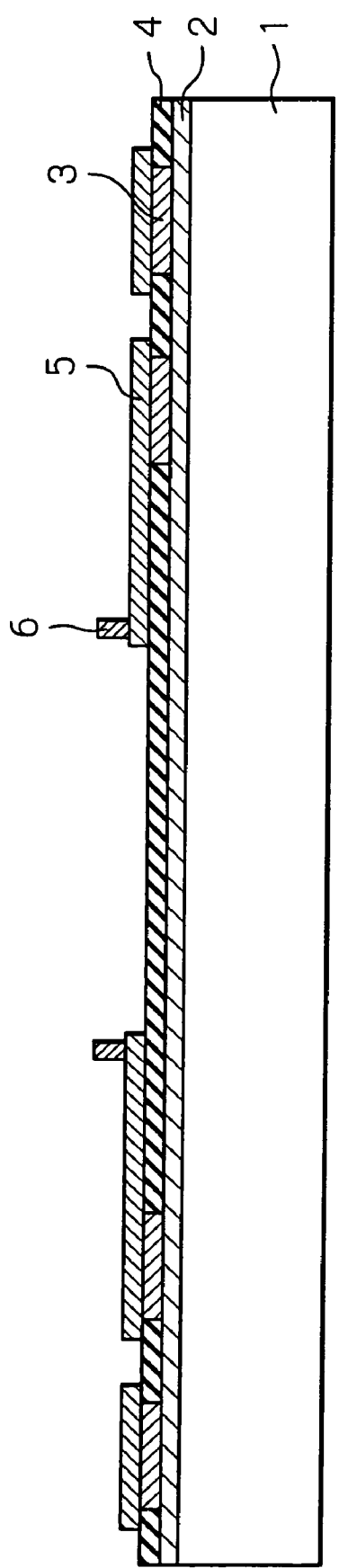

Next, referring to FIG. 1E, conductive posts (pads) 6 made of Cu or Ni are formed by a photolithography process and an electroplating process using the seed metal layer 2 as a cathode electrode. The conductive posts 6 are electrically connected to the conductive pattern layer 5.

Figure 1F:
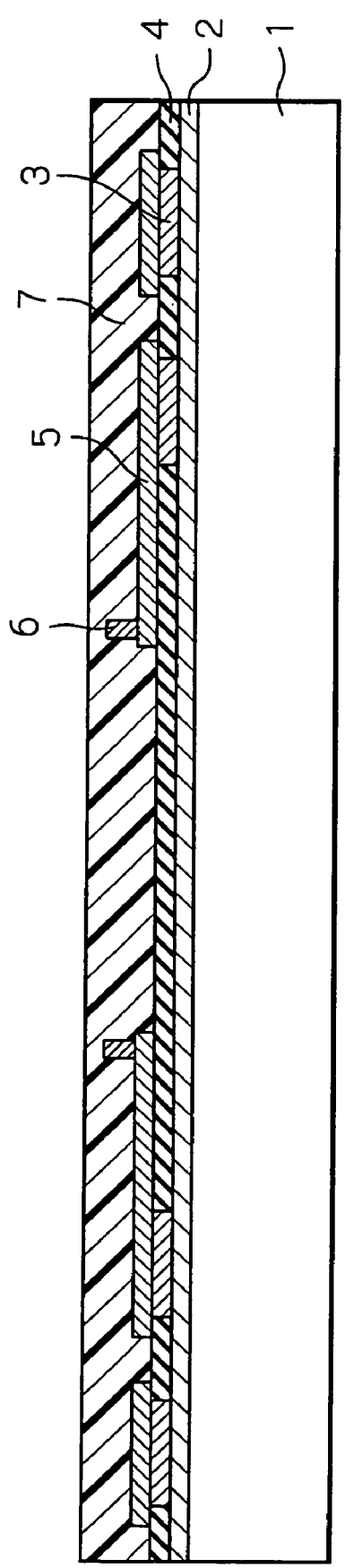

Next, referring to FIG. 1F, a thermoplastic resin layer 7 made of thermoplastic polyimide as an adhesive layer is coated on the entire surface to cover the conductive pattern layer 5 and the conductive posts 6.

Figure 1G:
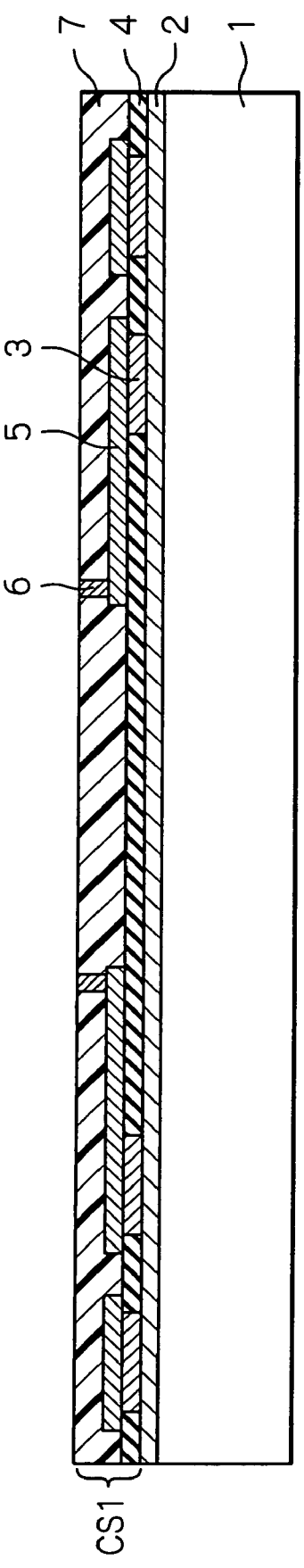

Next, referring to FIG. 1G, the thermoplastic resin layer 7 is flattened by a CMP process, a grinding process or a cutting process to expose the upper surface of the conductive posts 6. Note that, if the conductive posts 6 are made of Cu, a copper oxidation preventing layer (not shown) made of Au can also be formed on the surface of the conductive posts 6 by an electroplating process using the seed metal layer 2 as a cathode electrode.

Thus, an interconnection structure CS1 is formed by the conductive posts 3, the insulating resin layer 4, the conductive pattern layer 5, the conductive posts 6 and the thermoplastic resin layer 7.

Figure 1H:
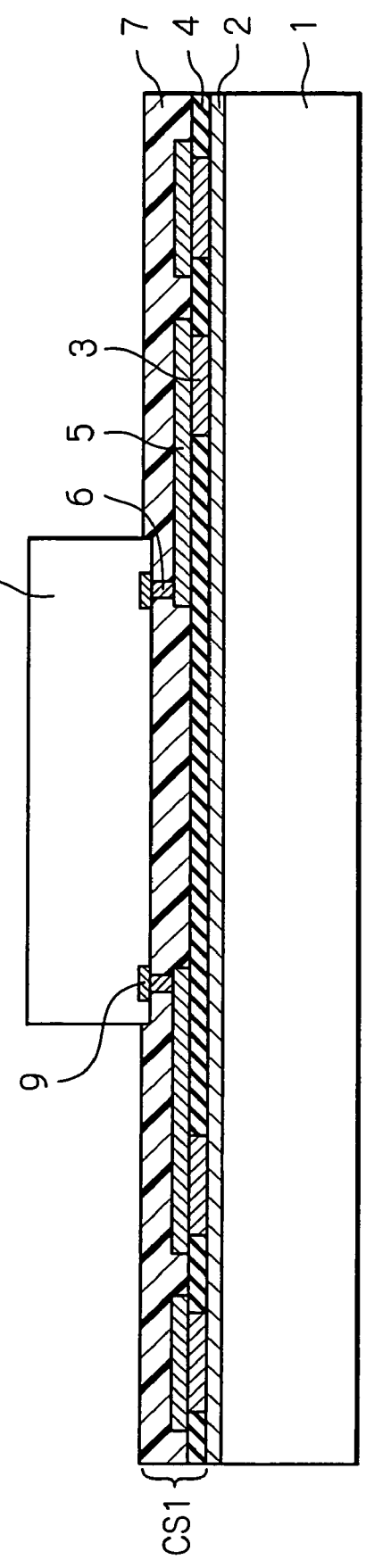

Next, referring to FIG. 1H, a semiconductor chip 8 made of silicon associated with electrodes 9 to which solder balls, electroplated balls or stud bumps are applied is faced down to the interconnection structure CS1, so that the electrodes 9 of the semiconductor chip 8 correspond to respective ones of the conductive posts 6 of the interconnection structure CS1. In this case, the support substrate 1 and/or the semiconductor chip 8 are heated so as to melt the thermoplastic resin layer 7. As a result, the electrical connection of the electrodes 9 of the semiconductor chip 1 to the conductive posts 6, the adhesion of the semiconductor chip 8 to the interconnection structure CS1 and the sealing of a gap between the semiconductor chip 8 and the insulating resin layer 4 are simultaneously carried out, which would decrease the number of manufacturing steps.

In FIG. 1H, since the interconnection structure CS1 is adhered to the support substrate 1, the interconnection structure CS1 thermally expands and shrinks as the support substrate 1 thermally expands and shrinks. In this case, since the support substrate 1 and the semiconductor chip 8 are substantially made of the same material such as silicon so that there is no substantial difference in thermal expansion coefficient therebetween, the semiconductor chip 8 also thermally expands and shrinks as the support substrate 1 thermally expands and shrinks.

Also, even if only one of the support substrate 1 and the semiconductor chip 8 is heated or they are heated to different temperatures, the support substrate 1 and the semiconductor chip 8 can be entirely heated while they are pressed against each other by an XY stage and a suction head (not shown), so that there is no substantial difference in temperature between the support substrate 1 and the semiconductor chip 8. For example, the support substrate 1 along with the interconnection structure CS1 is mounted on the XY stage and the semiconductor chip 8 is mounted on the suction head. Then, the suction head is pressed against the XY stage, so that the support substrate 1 and the semiconductor chip 8 are pressed against each other. Then, the support substrate 1 is heated by a heater incorporated into the XY stage to about 100° C., while the semiconductor chip 8 is heated by a heater incorporated into the suction head to about 300° C. Therefore, even if the width of the conductive posts 6 becomes narrower and the spacing (pitch) between the conductive posts 6 becomes smaller, the conductive posts 6 can suitably correspond to the electrodes 9 of the semiconductor chip 8.

Next, referring to FIG. 1I, the interconnection structure CS1 is sealed by a sealing resin layer 10 by a molding process, a printing process or a potting process. In this case, although the back surface of the semiconductor chip 8 is sealed by the sealing resin layer 10 as shown in FIG. 1I, this back surface can be exposed to the air.

Next, referring to FIG. 1J, the support substrate 1 is removed from the seed metal layer 2 by a CMP process, a grinding process, a cutting process, a wet etching process, a dry etching process, or some combination of the processes. For example, if a dry etching process as a final process is performed upon the support substrate 1, the etching ratio of the support substrate 1 to the seed metal layer 2 is so large that the seed metal layer 2 can surely be left. As a result, the conductive posts 3 and the border portion between the conductive posts 3 and the insulating resin layer 4 are surely covered by the seed metal layer 2, thus preventing the conductive posts 3 from being damaged and the border portion between the conductive posts 3 and the insulating resin layer 4 from being cracked.

Next, referring to FIG. 1K, the seed metal layer 2 is removed from the interconnection structure CS1 by an etching process to expose the conductive posts 3.

Finally, referring to FIG. 1L, external electrodes 11 such as solder balls, electroplated balls or stud bumps are adhered to the conductive posts 3.

Note that although a single semiconductor module is illustrated in FIGS. 1A through 1L, a plurality of semiconductor modules are actually manufactured. Therefore, after the process as shown in FIG. 1L, the plurality of semiconductor modules are separated from each other by a dicing process.

A second embodiment of the method for manufacturing a semiconductor module according to the present invention will be explained next with reference to FIGS. 2A through 2P.

Figure 2A:
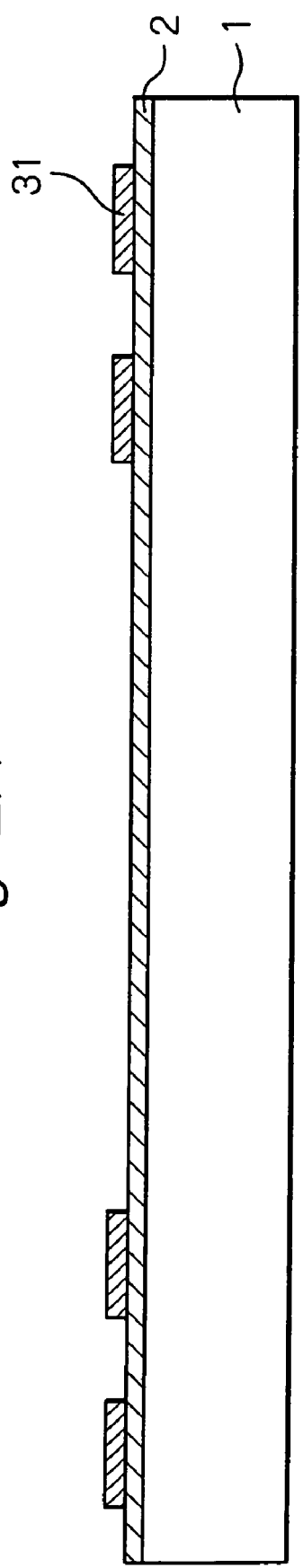
FIGS. 2A through 2P are cross-sectional views for explaining a second embodiment of the method for manufacturing a semiconductor module according to the present invention.

First, referring to FIG. 2A, in a similar way to those of FIG. 1A, a support substrate 1 such as a silicon wafer is prepared. Then, a seed metal layer 2 made of Cu or Ni as an electroplating intervening layer is deposited on the entire surface by a sputtering process or the like. Then, conductive posts (pads) 31 made of Cu or Ni are formed on the seed metal layer 2 by a photolithography process and an electroplating process using the seed metal layer 2 as a cathode electrode.

Figure 2B:
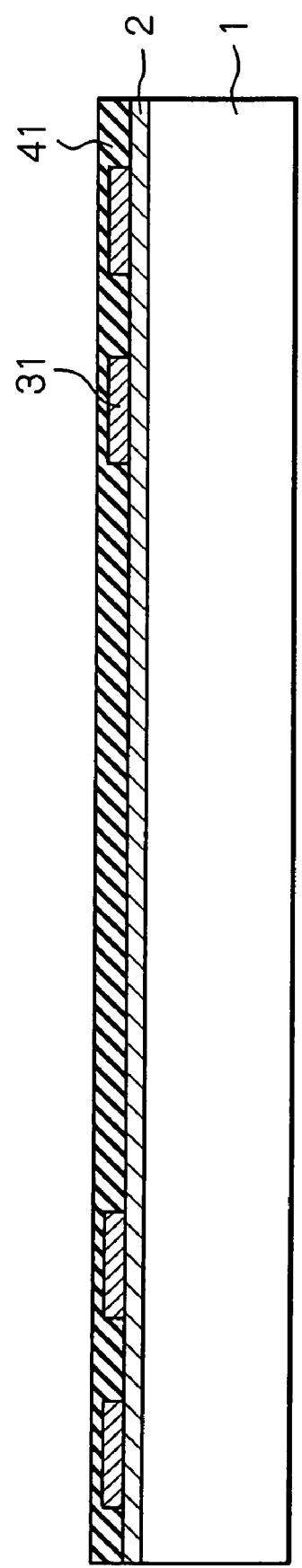

Next, referring to FIG. 2B, in a similar way to those of FIG. 1B, an insulating resin layer 41 made of polyimide resin or epoxy resin is coated on the entire surface by a spin-coat process, and then sintered.

Figure 2C:
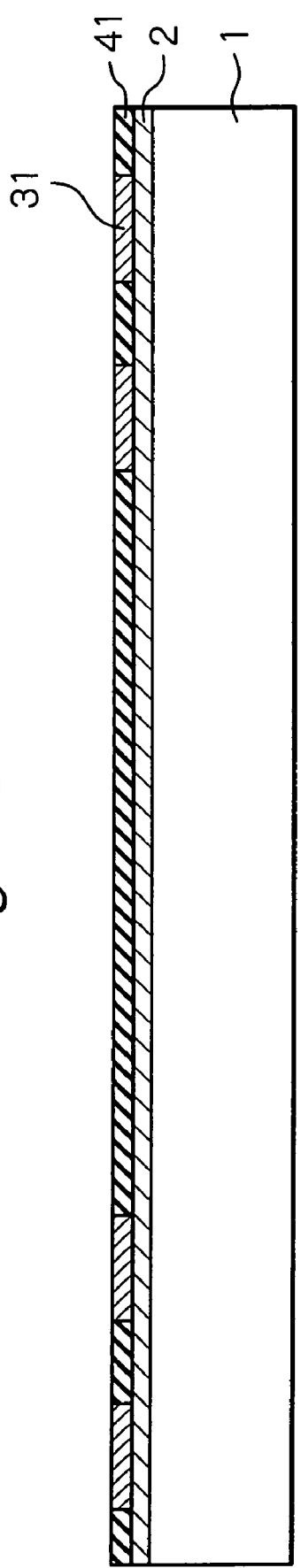

Next, referring to FIG. 2C, in a similar way to those of FIG. 1C, the insulating resin layer 41 is flattened by a CMP process, a grinding process or a cutting process to expose the upper surface of the conductive posts 31.

Figure 2D:
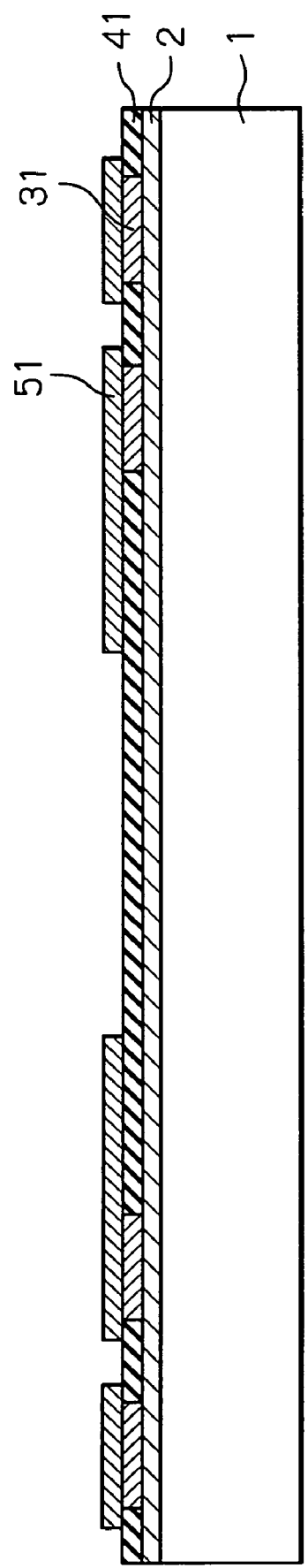

Next, referring to FIG. 2D, in a similar way to those of FIG. 1D, a conductive pattern layer 51 serving as interconnections made of Cu or Ni is formed by a photolithography process and an electroplating process using the seed metal layer 2 as a cathode electrode. The conductive pattern layer 51 is electrically connected to the conductive posts 31.

Figure 2E:
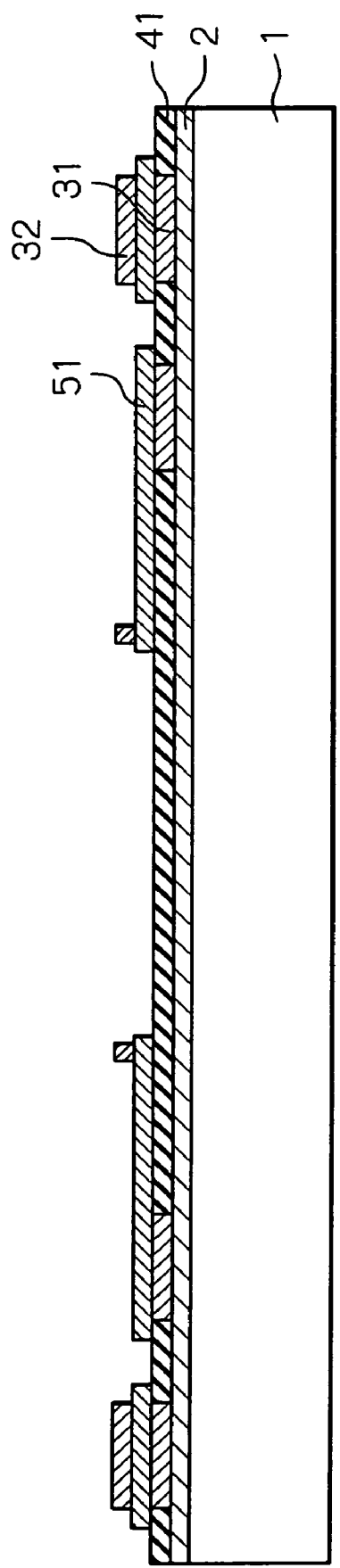

Next, referring to FIG. 2E, conductive posts 32 made of Cu or Ni are formed on the conductive pattern layer 51 by a photolithography process and an electroplating process using the seed metal layer 2 as a cathode electrode. The conductive posts 32 are electrically connected to the conductive pattern layer 51.

Figure 2F:
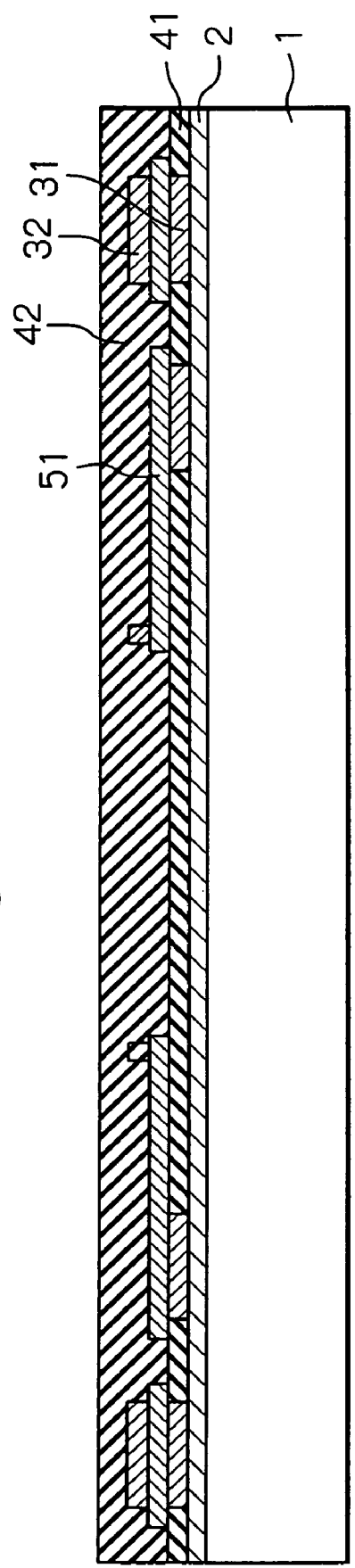

Next, referring to FIG. 2F, an insulating resin layer 42 made of polyimide resin or epoxy resin is coated on the entire surface by a spin-coat process, and then sintered.

Figure 2G:
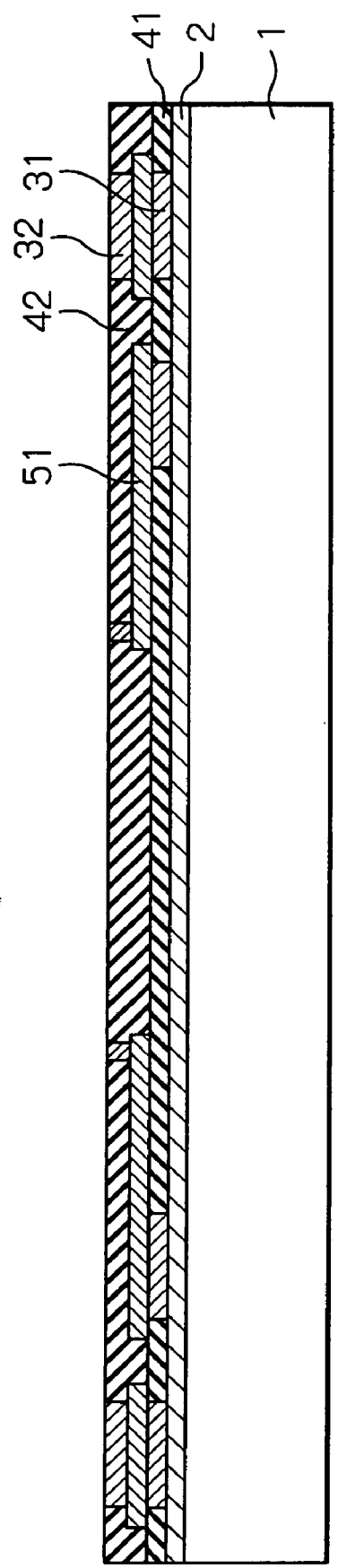

Next, referring to FIG. 2G, the insulating resin layer 42 is flattened by a CMP process, a grinding process or a cutting process to expose the upper surface of the conductive posts 32.

Figure 2H:
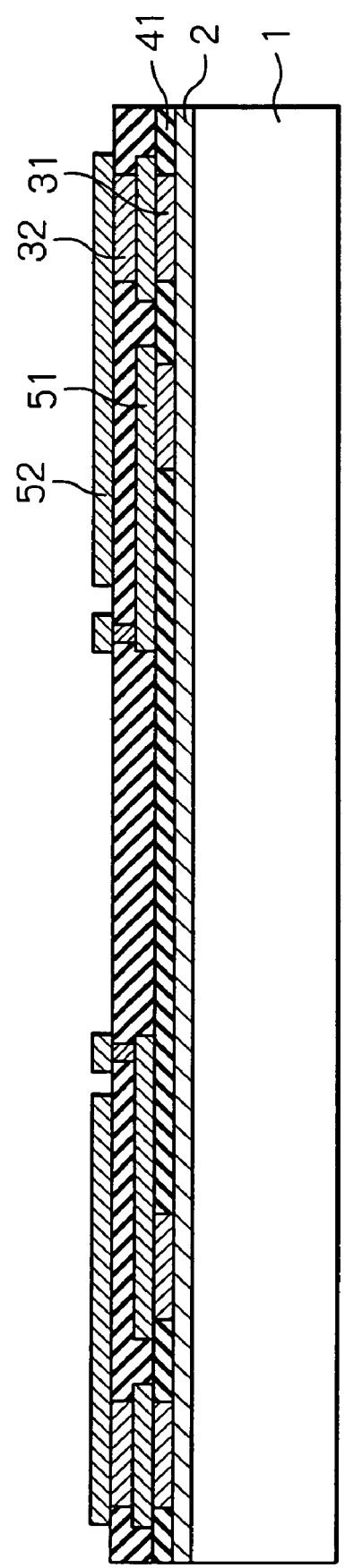

Next, referring to FIG. 2H, a conductive pattern layer 52 serving as interconnections made of Cu or Ni is formed by a photolithography process and an electroplating process using the seed metal layer 2 as a cathode electrode. The conductive pattern layer 52 is electrically connected to the conductive posts 32.

Next, referring to FIG. 2I, in a similar way to those of FIG. 1E, conductive posts (pads) 6 made of Cu or Ni are formed by a photolithography process and an electroplating process using the seed metal layer 2 as a cathode electrode. The conductive posts 6 are electrically connected to the conductive pattern layer 52.

Next, referring to FIG. 2J, in a similar way to those of FIG. 1F, a thermoplastic resin layer 7 made of thermoplastic polyimide as an adhesive layer is coated on the entire surface to cover the conductive pattern layer 52 and the conductive posts 6.

Figure 2K:
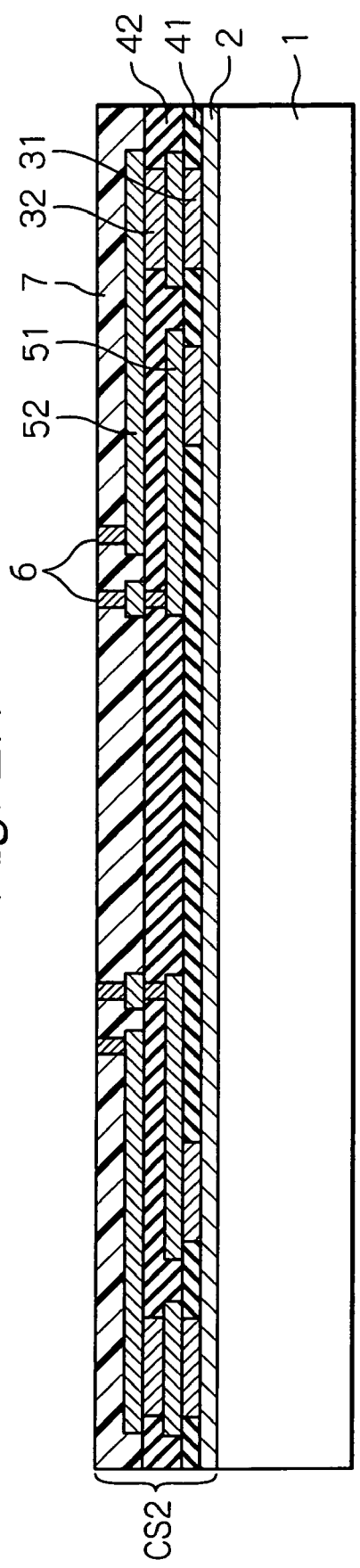

Next, referring to FIG. 2K, in a similar way to those of FIG. 1G, the thermoplastic resin layer 7 is flattened by a CMP process, a grinding process or a cutting process to expose the upper surface of the conductive posts 6.

Thus, an interconnection structure CS2 is formed by the conductive posts 31, the insulating resin layer 41, the conductive pattern layer 51, the conductive posts 32, the insulating resin layer 42, the conductive pattern layer 52, the conductive posts 6 and the thermoplastic resin layer 7.

Figure 2L:
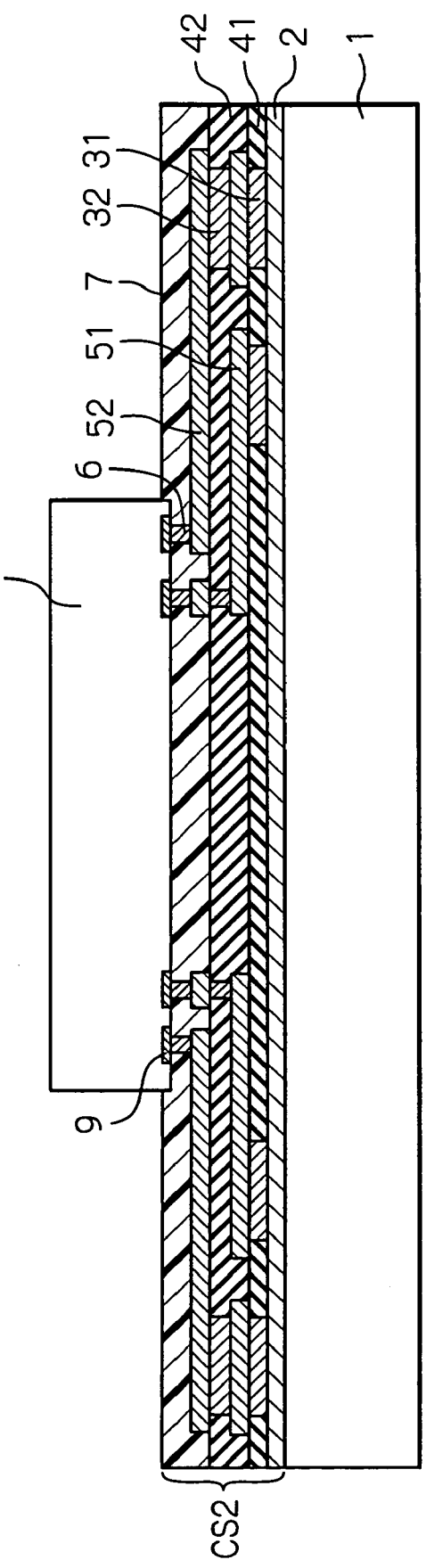

Next, referring to FIG. 2L, in a similar way to those of FIG. 1H, a semiconductor chip 8 made of silicon associated with electrodes 9 to which solder balls, electroplated balls or stud bumps are applied is faced down to the interconnection structure CS2, so that the electrodes 9 of the semiconductor chip 8 correspond to respective ones of the conductive posts 6 of the interconnection structure CS2. In this case, the support substrate 1 and/or the semiconductor chip 8 are heated so as to melt the thermoplastic resin layer 7. As a result, the electrical connection of the electrodes 9 of the semiconductor chip 1 to the conductive posts 6, the adhesion of the semiconductor chip 8 to the interconnection structure CS and the sealing of a gap between the semiconductor chip 8 and the insulating resin layer 42 are simultaneously carried out, which would decrease the number of manufacturing steps.

Even in FIG. 2L, in a similar way to those of FIG. 1H, since the interconnection structure CS2 is adhered to the support substrate 1, the interconnection structure CS2 thermally expands and shrinks as the support substrate 1 thermally expands and shrinks. In this case, since the support substrate 1 and the semiconductor chip 8 are substantially made of the same material such as silicon so that there is no substantial difference in thermal expansion coefficient therebetween, the semiconductor chip 8 also thermally expands and shrinks as the support substrate 1 thermally expands and shrinks. Therefore, even if the width of the conductive posts 6 becomes narrower and the spacing (pitch) between the conductive posts 6 becomes smaller, the conductive posts 6 can suitably correspond to the electrodes 9 of the semiconductor chip 8.

Next, referring to FIG. 2M, in a similar way to those of FIG. 1I, the interconnection structure CS2 is sealed by a sealing resin layer 10 by a molding process, a printing process or a potting process.

Next, referring to FIG. 2N, in a similar way to those of FIG. 1J, the support substrate 1 is removed from the seed metal layer 2 by a CMP process, a grinding process, a cutting process, a wet etching process, a dry etching process, or some combination of the processes. As a result, the conductive posts 31 (32) and the border portion between the conductive posts 31 (32) and the insulating resin layer 41 (42) are surely covered by the seed metal layer 2, thus preventing the conductive posts 31 (32) from being damaged and the border portion between the conductive posts 31 (32) and the insulating resin layer 41 (42) from being cracked.

Figure 2O:
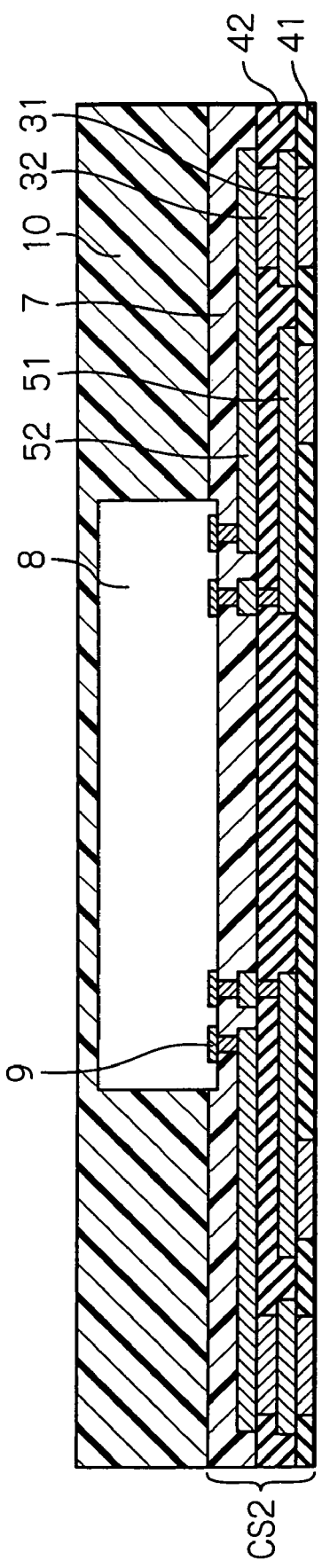

Next, referring to FIG. 2O, in a similar way to those of FIG. 1K, the seed metal layer 2 is removed from the interconnection structure CS2 by an etching process to expose the conductive posts 31.

Figure 2P:
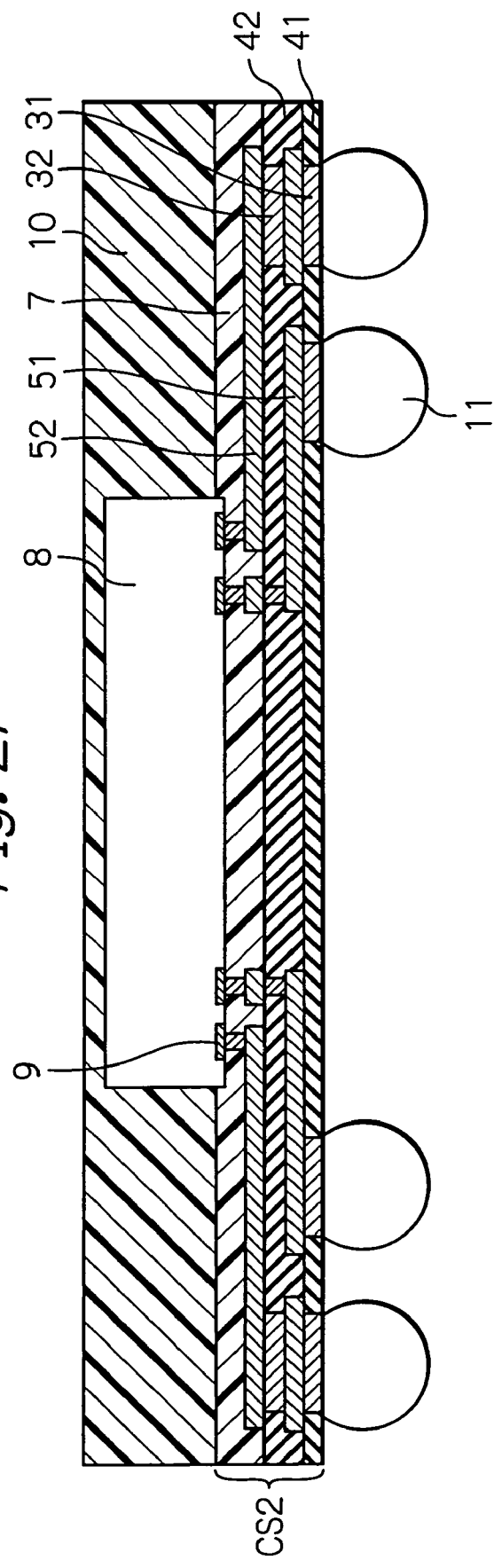

Finally, referring to FIG. 2P, in a similar way to those of FIG. 1L, external electrodes 11 such as solder balls, electroplated balls or stud bumps are adhered to the conductive posts 31.

Note that although a single semiconductor module is illustrated in FIGS. 2A through 2P, a plurality of semiconductor modules are actually manufactured. Therefore, after the process as shown in FIG. 2P, the plurality of semiconductor modules are separated from each other by a dicing process.

A third embodiment of the method for manufacturing a semiconductor module according to the present invention will be explained next with reference to FIGS. 3A, 3B and 3C.

First, referring to FIG. 3A, an interconnection structure CS1 adhered by a semiconductor chip 8 associated with electrodes 9 is obtained by the processes as shown in FIGS. 1A through 1K, except that a thermoplastic resin layer 7' is formed instead of the insulating resin layer 4 of the interconnection structure CS1.

Thus, the interconnection structure CS1 is formed by the conductive posts 3, the thermoplastic resin layer 7', the conductive pattern layer 5, the conductive posts 6 and the thermoplastic resin layer 7.

Next, referring to FIG. 3B, a semiconductor chip 12 made of silicon associated with electrodes 13 to which solder balls, electroplated balls or stud bumps are applied is faced down to the interconnection structure CS1, so that the electrodes 13 of the semiconductor chip 12 correspond to respective ones of the conductive posts 3 of the interconnection structure CS1. In this case, the semiconductor chip 8 (the interconnection structure CS1) and/or the semiconductor chip 12 are heated so as to melt the thermoplastic resin layer 7'. As a result, the electrical connection of the electrodes 13 of the semiconductor chip 12 to the conductive posts 3, the adhesion of the semiconductor chip 12 to the interconnection structure CS1 and the sealing of a gap between the semiconductor chip 12 and the thermoplastic resin layer 7' are simultaneously carried out, which would decrease the number of manufacturing steps.

In FIG. 3B, since the interconnection structure CS1 is adhered to the semiconductor chip 12, the interconnection structure CS1 thermally expands and shrinks as the semiconductor chip 8 thermally expands and shrinks. In this case, since the semiconductor chip 8 and the semiconductor chip 12 are substantially made of the same material such as silicon so that there is no substantial difference in thermal expansion coefficient therebetween, the semiconductor chip 12 also thermally expands and shrinks as the semiconductor chip 8 thermally expands and shrinks.

Also, even if only one of the semiconductor chip 8 and the semiconductor chip 12 is heated or they are heated to different temperatures, the semiconductor chip 8 and the semiconductor chip 12 can entirely be heated while they are pushed to each other by pushing members (not shown), so that there is no substantial difference in temperature between the semiconductor chip 8 and the semiconductor chip 12. For example, the semiconductor chip 8 and the semiconductor chip 12 are heated to about 300° C. Therefore, even if the width of the conductive posts 3 becomes narrower and the spacing (pitch) between the conductive posts 3 becomes smaller, the conductive posts 3 can suitably correspond to the electrodes 13 of the semiconductor chip 12.

Further, in FIG. 3B, when the semiconductor chip 8 and/or the semiconductor chip 12 are heated, the thermoplastic resin layer 7 may be remelted; however, in this case, the semiconductor chip 8 is pressed against the semiconductor chip 12 by an XY stage and a suction head, no problem would occur. In this case, actually, the semiconductor chip 8 along with the interconnection structure CS1 is mounted on the XY stage and the semiconductor chip 12 is mounted on the suction head. Then, the suction head is pressed against the XY stage, so that the semiconductor chip 8 and the semiconductor chip 12 are pressed against each other. Then, only the semiconductor chip 12 is heated by a heater incorporated into the suction head, thus completely preventing the thermoplastic resin layer 7 from remelting.

Figure 3C:
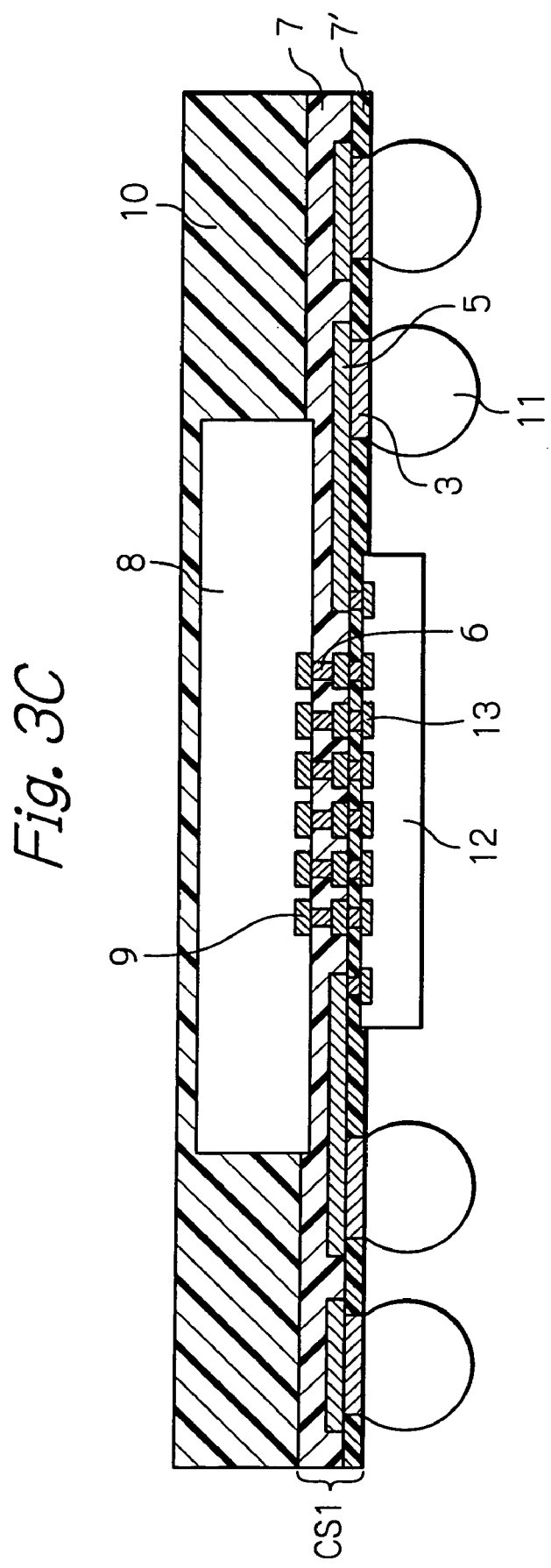

Finally, referring to FIG. 3C, external electrodes 11 such as solder balls, electroplated balls or stud bumps are adhered to the conductive posts 3.

Note that although a single semiconductor module is illustrated in FIGS. 3A through 3C, a plurality of semiconductor modules are actually manufactured. Therefore, after the process as shown in FIG. 3C, the plurality of semiconductor modules are separated from each other by a dicing process.

A fourth embodiment of the method for manufacturing a semiconductor module according to the present invention will be explained next with reference to FIGS. 4A, 4B and 4C.

First, referring to FIG. 4A, an interconnection structure CS2 adhered by a semiconductor chip 8 associated with electrodes 9 is obtained by the processes as shown in FIGS. 2A through 2N, except that a thermoplastic resin layer 7' is formed instead of the insulating resin layer 4 of the interconnection structure CS2.

Thus, the interconnection structure CS2 is formed by the conductive posts 31, the thermoplastic resin layer 7', the conductive pattern layer 51, the conductive posts 32, the insulating resin layer 42, the conductive pattern layer 52, the conductive posts 6 and the thermoplastic resin layer 7.

Next, referring to FIG. 4B, a semiconductor chip 12 made of silicon associated with electrodes 13 to which solder balls, electroplated balls or stud bumps are applied is faced down to the interconnection structure CS2, so that the electrodes 13 of the semiconductor chip 12 correspond to respective ones of the conductive posts 31 of the interconnection structure CS2. In this case, the semiconductor chip 8 (the interconnection structure CS2) and/or the semiconductor chip 12 are heated so as to melt the thermoplastic resin layer 7'. As a result, the electrical connection of the electrodes 13 of the semiconductor chip 12 to the conductive posts 31, the adhesion of the semiconductor chip 12 to the interconnection structure CS2 and the sealing of a gap between the semiconductor chip 12 and the thermoplastic resin layer 7' are simultaneously carried out, which would decrease the number of manufacturing steps.

In FIG. 4B, since the interconnection structure CS2 is adhered to the semiconductor chip 12, the interconnection structure CS2 thermally expands and shrinks as the semiconductor chip 8 thermally expands and shrinks. In this case, since the semiconductor chip 8 and the semiconductor chip 12 are substantially made of the same material such as silicon so that there is no substantial difference in thermal expansion coefficient therebetween, the semiconductor chip 12 also thermally expands and shrinks as the semiconductor chip 8 thermally expands and shrinks. Therefore, even if the width of the conductive posts 31 becomes narrower and the spacing (pitch) between the conductive posts 31 becomes smaller, the conductive posts 31 can suitably correspond to the electrodes 13 of the semiconductor chip 12.

Figure 4C:
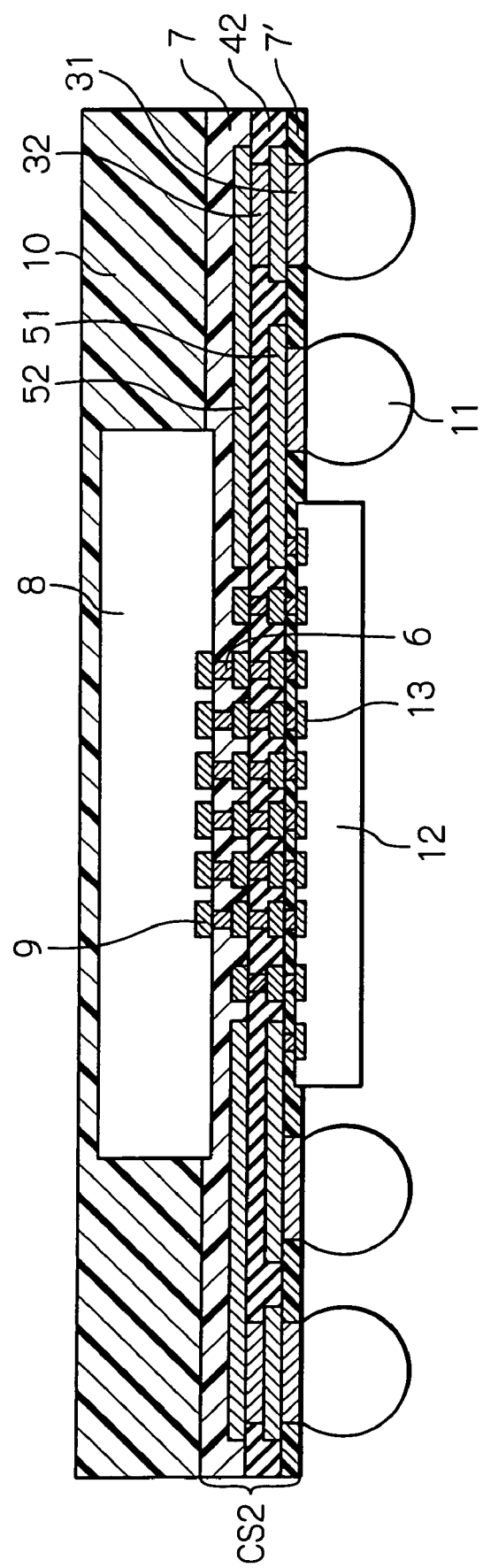

Finally, referring to FIG. 4C, external electrodes 11 such as solder balls, electroplated balls or stud bumps are adhered to the conductive posts 31.

Note that although a single semiconductor module is illustrated in FIGS. 4A through 4C, a plurality of semiconductor modules are actually manufactured. Therefore, after the process as shown in FIG. 4C, the plurality of semiconductor modules are separated from each other by a dicing process.

A fifth embodiment of the method for manufacturing a semiconductor module according to the present invention will be explained next with reference to FIGS. 5A, 5B and 5C.

First, referring to FIG. 5A, an interconnection structure CS1 adhered to a semiconductor chip 8 associated with electrodes 9 is obtained by the processes as shown in FIGS. 1A through 1K.

Thus, the interconnection structure CS1 is formed by the conductive posts 3, the insulating resin layer 4, the conductive pattern layer 5, the conductive posts 6 and the thermoplastic resin layer 7.

Next, referring to FIG. 5B, a build-up interconnection structure BCS is formed by a plurality of photosensitive insulating layers 201, 202 and 203 made of photosensitive epoxy and conductive structures (including a via and interconnect) 204 and 205 made of Cu alternating with the photosensitive insulating layers 201, 202 and 203.

Finally, referring to FIG. 5C, external electrodes 11 such as solder balls, electroplated balls or stud bumps are adhered to the conductive structure 205.

Note that although a single semiconductor module is illustrated in FIGS. 5A through 5C, a plurality of semiconductor modules are actually manufactured. Therefore, after the process as shown in FIG. 5C, the plurality of semiconductor modules are separated from each other by a dicing process.

A sixth embodiment of the method for manufacturing a semiconductor module according to the present invention will be explained next with reference to FIGS. 6A, 6B and 6C.

Figure 6A:
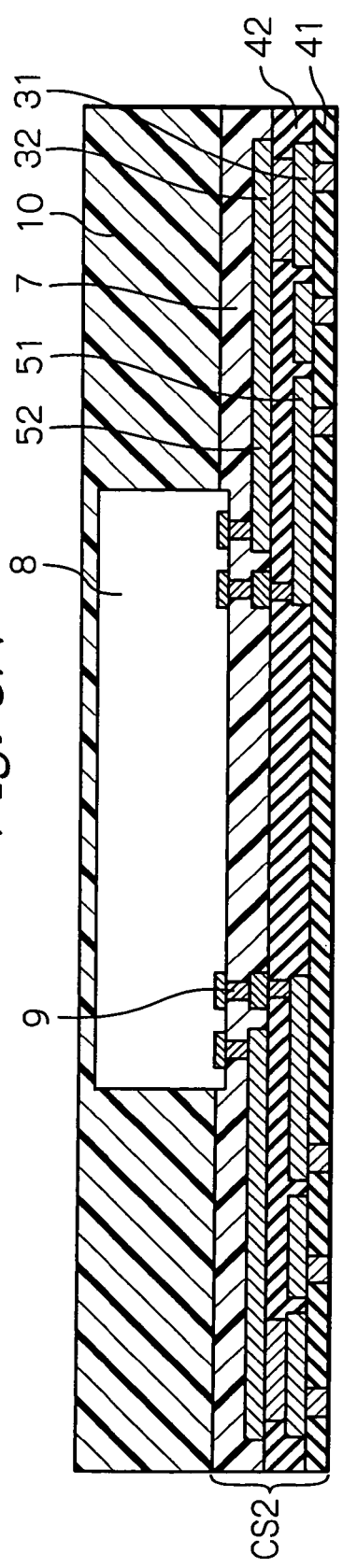
FIGS. 6A, 6B and 6C are cross-sectional views for explaining a sixth embodiment of the method for manufacturing a semiconductor module according to the present invention.

First, referring to FIG. 6A, a connection structure CS2 adhered to a semiconductor chip 8 associated with electrodes 9 is obtained by the processes as shown in FIGS. 2A through 2N.

Thus, the interconnection structure CS2 is formed by the conductive posts 31, the insulating resin layer 41, the conductive pattern layer 51, the conductive posts 32, the insulating resin layer 42, the conductive pattern layer 52, the conductive posts 6 and the thermoplastic resin layer 7.

Figure 6B:
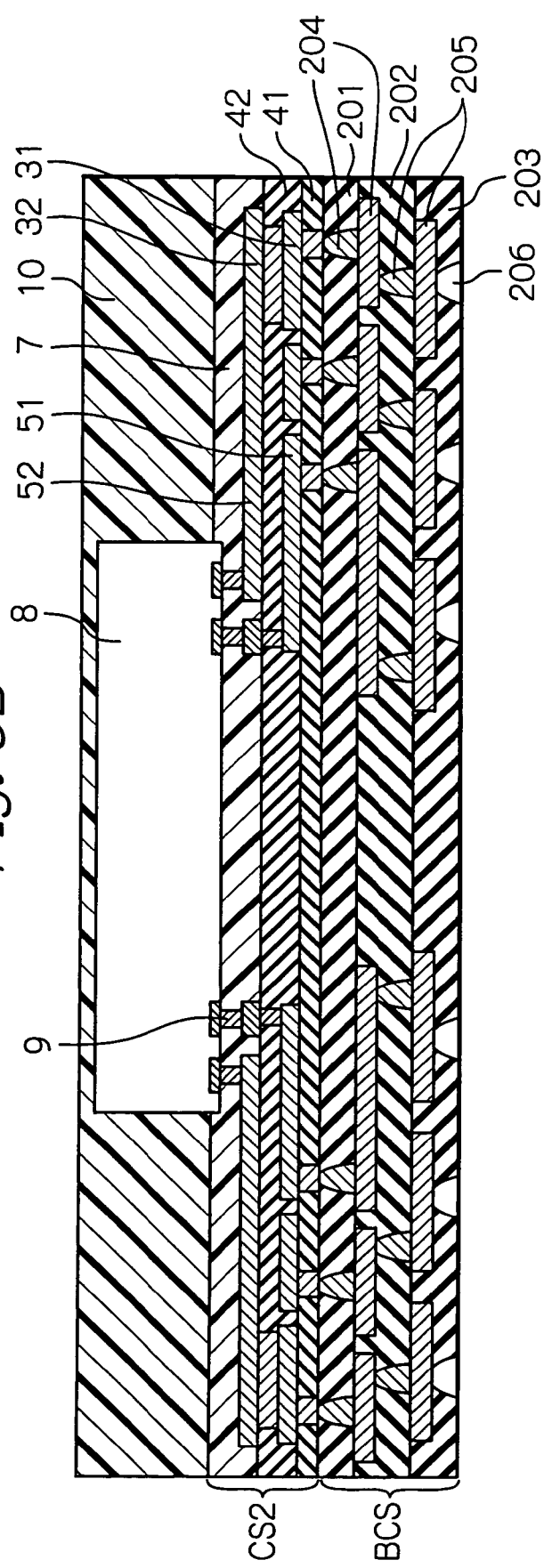

Next, referring to FIG. 6B, a build-up interconnection structure BCS is formed by a plurality of photosensitive insulating layers 201, 202 and 203 made of photosensitive epoxy and conductive structures 204 and 205 made of Cu alternating with the photosensitive insulating layers 201, 202 and 203.

Figure 6C:
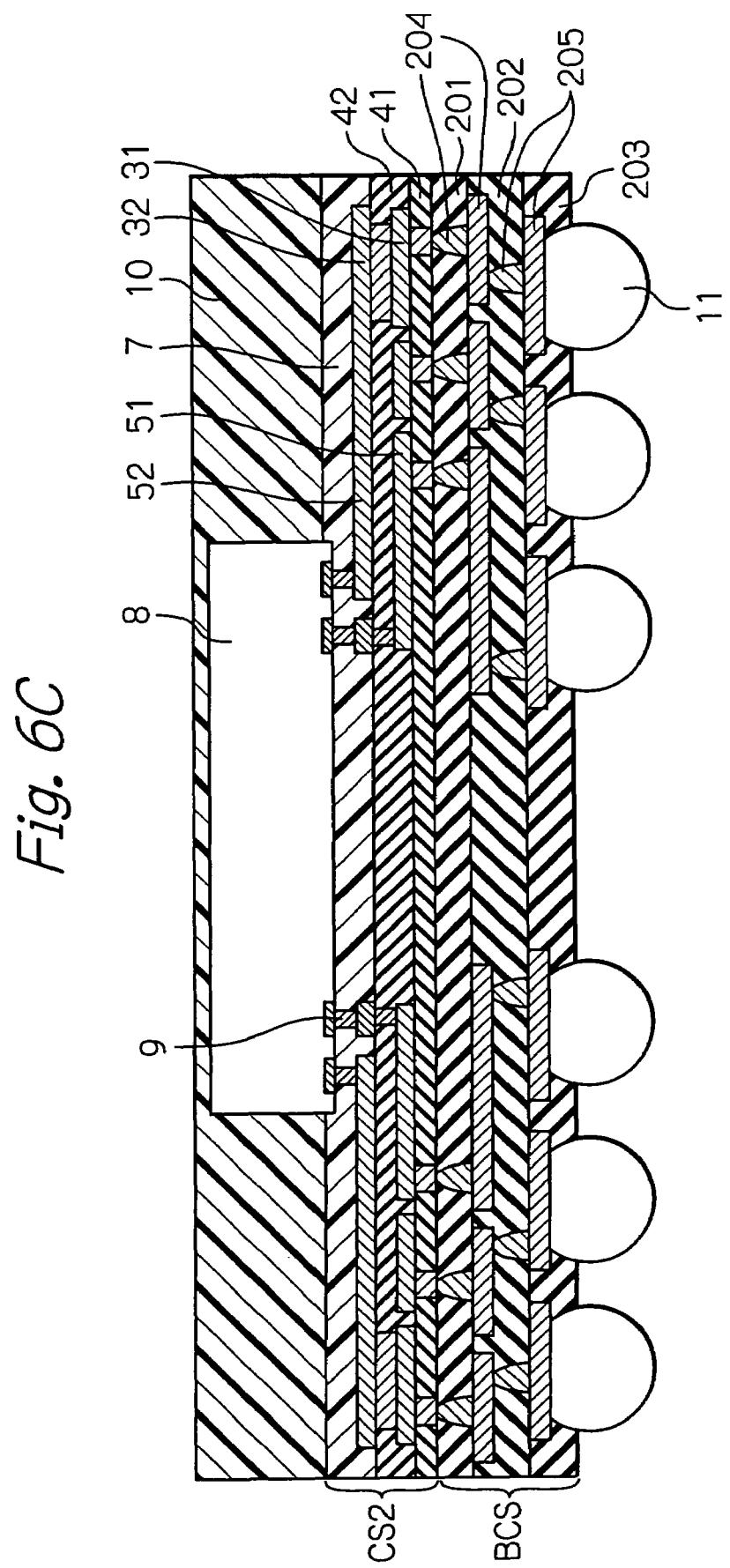

Finally, referring to FIG. 6C, external electrodes 11 such as solder balls, electroplated balls or stud bumps are adhered to the conductive structure 205.

Note that although a single semiconductor module is illustrated in FIGS. 6A through 6C, a plurality of semiconductor modules are actually manufactured. Therefore, after the process as shown in FIG. 6C, the plurality of semiconductor modules are separated from each other by a dicing process.

In the above-described first, second, fifth and sixth embodiments, the conductive posts 3 and 31 can be formed by coating a photosensitive resin layer on the seed metal layer 2 and forming throughholes in the photosensitive resin layer by a photolithography process, thus forming the conductive posts 3 and 31 within the throughholes, which would decrease the number of manufacturing steps.

Also, in the above-described embodiments, the thermoplastic resin layer 7 can be replaced by a semi-cured stage (B-stage) thermosetting resin layer such as epoxy. In this case, the semiconductor chip 8 is adhered to the B-stage thermosetting resin layer without a heating process, and then, this thermosetting resin layer is completely cured by a heating process.

Further, in the above-described embodiments, resin contact layers made of Ti for being in good contact with resin can be included in the conductive posts and the conductive pattern layers, as occasion demands.

Additionally, each of the semiconductor chips 8 and 12 can be replaced by another semiconductor device such as ball grid array (BGA) package, a pin grid array (PGA) package or the like. In this case, the support substrate 1 is made of a material having substantially the same thermal expansion coefficient as that of such semiconductor devices. Further, a plurality of semiconductor devices can be mounted on each surface of the semiconductor module.

Still further, in the above-described embodiments, the semiconductor chips 8 and 12 can be made of materials other than silicon; in this case, the support substrate 1 is also made of such materials so that there is no substantial difference in thermal expansion coefficient therebetween.

The invention claimed is:

1. A method for manufacturing a semiconductor module comprising the following steps in the order recited:
   forming a metal layer on a support substrate;
   forming first conductive posts and a first insulating layer on said metal layer, said first insulating layer surrounding sides of said first conductive posts;
   forming second conductive posts above said first conductive posts, said second conductive posts being electrically connected to said first conductive posts;
   forming a second insulating layer so as to cover said second conductive posts, said second insulating layer being made of adhesive resin;
   adhering a first semiconductor device to said second conductive posts by said second insulating layer while a gap between said first semiconductor device and said first insulating layer is sealed by said second insulating layer.

2. The method as set forth in claim 1, wherein said adhesive resin is thermoplastic resin, and said adhering comprises heating at least one of said support substrate and said semiconductor device.

3. The method as set forth in claim 1, wherein said adhesive resin is thermosetting resin, and said method further comprises heating at least one of said support substrate and said first semiconductor device after said first semiconductor device is adhered to said second conductive posts by said thermosetting resin which is in a B-stage.

4. The method as set forth in claim 1, wherein said support substrate has substantially the same thermal expansion coefficient as that of said first semiconductor device.

5. The method as set forth in claim 1, further comprising forming a sealing resin layer on said second insulating layer to seal said first semiconductor device.

6. The method as set forth in claim 1, further comprising removing said support substrate from said metal layer after said first semiconductor device is adhered to said second conductive posts.

7. The method as set forth in claim 6, further comprising removing said metal layer to expose said first conductive posts after said support substrate is removed.

8. The method as set forth in claim 5, further comprising removing said support substrate from said metal layer after said sealing resin layer is formed.

9. The method as set forth in claim 8, further comprising removing said metal layer to expose said first conductive posts after said support substrate is removed.

10. The method as set forth in claim 7, further comprising adhering external electrodes to said exposed first conductive posts.

11. The method as set forth in claim 9, further comprising adhering external electrodes to said exposed first conductive posts.

12. The method as set forth in claim 1, further comprising a first conductive pattern layer between said first and second conductive posts and electrically connected to said first and second conductive posts.

13. The method as set forth in claim 12, further comprising:
   forming third conductive posts on said first conductive pattern layer, said third conductive posts being electrically connected to said first conductive pattern; and
   forming a second conductive pattern layer on said third conductive posts before said second conductive posts are formed, said second conductive pattern layer being electrically connected to said second and third conductive posts.

14. The method as set forth in claim 7, wherein said first insulating layer is made of adhesive resin, and said method further comprises adhering a second semiconductor device to a back surface of said first insulating layer while a gap between said second semiconductor device and said first conductive posts is sealed by said first insulating layer, after said metal layer is removed.

15. The method as set forth in claim 9, wherein said first insulating layer is made of adhesive resin, and said method further comprises adhering a second semiconductor device to a back surface of said first insulating layer while a gap between said second semiconductor device and said first conductive posts is sealed by said first insulating layer, after said metal layer is removed.

16. The method as set forth in claim 14, wherein said adhesive resin is thermoplastic resin, and said adhering comprises heating at least one of said first and second semiconductor devices.

17. The method as set forth in claim 15, wherein said adhesive resin is thermoplastic resin, and said adhering comprises heating at least one of said first and second semiconductor devices.

18. The method as set forth in claim 7, further comprising:
   forming a buildup interconnection structure on said exposed first conductive posts; and
   adhering external electrodes to said buildup interconnection structure.

19. The method as set forth in claim 1, wherein said forming a second insulating layer comprises covering said second conductive posts and then removing part of said second insulating layer to expose tops of said second conductive posts.

* * * * *